(12) United States Patent
Yamagata et al.

(10) Patent No.: US 8,497,525 B2
(45) Date of Patent: *Jul. 30, 2013

(54) LIGHT EMITTING DEVICE AND METHOD OF MANUFACTURING THE SAME

(75) Inventors: Hirokazu Yamagata, Kanagawa (JP); Shunpei Yamazaki, Tokyo (JP); Toru Takayama, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 230 days.

This patent is subject to a terminal disclaimer.

(21) Appl. No.: 12/898,775

(22) Filed: Oct. 6, 2010

(65) Prior Publication Data

US 2011/0024787 A1 Feb. 3, 2011

Related U.S. Application Data

(60) Continuation of application No. 12/352,615, filed on Jan. 13, 2009, now Pat. No. 7,825,419, and a continuation of application No. 11/890,494, filed on Aug. 7, 2007, now Pat. No. 7,485,478, and a division of application No. 10/073,284, filed on Feb. 13, 2002, now Pat. No. 7,264,979.

(30) Foreign Application Priority Data

Feb. 19, 2001 (JP) .................................. 2001-041195

(51) Int. Cl.
 *H01L 33/54* (2010.01)
 *H01L 33/56* (2010.01)
(52) U.S. Cl.
 USPC ............... 257/100; 438/26; 438/115; 438/22; 257/E33.063

(58) Field of Classification Search
 USPC ............... 438/22, 26, 115; 257/E33.063, 100
 See application file for complete search history.

(56) References Cited

U.S. PATENT DOCUMENTS

| 4,891,334 A | 1/1990 | Satoh et al. |
| 5,447,824 A | 9/1995 | Mutsaers et al. |

(Continued)

FOREIGN PATENT DOCUMENTS

| EP | 0 862 156 A1 | 9/1998 |
| EP | 0 932 137 A1 | 7/1999 |

(Continued)

OTHER PUBLICATIONS

Examination Report dated Aug. 22, 2008 from the Austrian Patent Office for Singapore Patent Application No. 200307843-3 filed Feb. 4, 2002.

(Continued)

*Primary Examiner* — George Fourson, III
(74) *Attorney, Agent, or Firm* — Nixon Peabody LLP; Jeffrey L. Costellia

(57) ABSTRACT

A high-quality light emitting device is provided which has a long-lasting light emitting element free from the problems of conventional ones because of a structure that allows less degradation, and a method of manufacturing the light emitting device is provided. After a bank is formed, an exposed anode surface is wiped using a PVA (polyvinyl alcohol)-based porous substance or the like to level the surface and remove dusts from the surface. An insulating film is formed between an interlayer insulating film on a TFT and the anode. Alternatively, plasma treatment is performed on the surface of the interlayer insulating film on the TFT for surface modification.

31 Claims, 23 Drawing Sheets

U.S. PATENT DOCUMENTS

| | | | |
|---|---|---|---|
| 5,550,066 A | 8/1996 | Tang et al. |
| 5,669,979 A | 9/1997 | Elliott et al. |
| 5,684,365 A | 11/1997 | Tang et al. |
| 5,744,824 A | 4/1998 | Kousai et al. |
| 5,804,918 A | 9/1998 | Yazawa et al. |
| 5,853,904 A | 12/1998 | Hall et al. |
| 5,853,905 A | 12/1998 | So et al. |
| 5,929,561 A | 7/1999 | Kawami et al. |
| 5,938,897 A | 8/1999 | Isao et al. |
| 5,952,128 A | 9/1999 | Isao et al. |
| 6,055,034 A | 4/2000 | Zhang et al. |
| 6,120,584 A | 9/2000 | Sakata et al. |
| 6,150,668 A | 11/2000 | Bao et al. |
| 6,187,684 B1 | 2/2001 | Farber et al. |
| 6,188,176 B1 | 2/2001 | Nakaya et al. |
| 6,194,837 B1 | 2/2001 | Ozawa |
| 6,218,206 B1 | 4/2001 | Inoue et al. |
| 6,246,179 B1 | 6/2001 | Yamada |
| 6,249,333 B1 | 6/2001 | Zhang et al. |
| 6,308,369 B1 | 10/2001 | Garcia et al. |
| 6,369,507 B1 | 4/2002 | Arai |
| 6,373,453 B1 | 4/2002 | Yudasaka |
| 6,380,672 B1 | 4/2002 | Yudasaka |
| 6,420,834 B2 | 7/2002 | Yamazaki et al. |
| 6,492,778 B1 | 12/2002 | Segawa |
| 6,545,424 B2 | 4/2003 | Ozawa |
| 6,551,914 B1 | 4/2003 | Suzuki et al. |
| 6,555,968 B2 | 4/2003 | Yamazaki et al. |
| 6,569,544 B1 | 5/2003 | Alain et al. |
| 6,674,244 B2 | 1/2004 | Segawa |
| 6,692,845 B2 | 2/2004 | Maruyama et al. |
| 6,727,047 B2 | 4/2004 | Montgomery et al. |
| 6,774,574 B1 | 8/2004 | Koyama |
| 6,777,887 B2 | 8/2004 | Koyama |
| 6,828,727 B2 | 12/2004 | Yamazaki |
| 6,836,067 B1 | 12/2004 | Imai |
| 6,852,994 B2 | 2/2005 | Seki et al. |
| 6,936,846 B2 | 8/2005 | Koyama et al. |
| 6,969,569 B2 | 11/2005 | Montgomery et al. |
| 6,992,439 B2 | 1/2006 | Yamazaki et al. |
| 7,015,503 B2 | 3/2006 | Seki et al. |
| 7,142,781 B2 | 11/2006 | Koyama et al. |
| 7,214,959 B2 | 5/2007 | Seki et al. |
| 7,273,801 B2 | 9/2007 | Seki et al. |
| 7,341,760 B2 | 3/2008 | Maruyama et al. |
| 7,662,011 B2 | 2/2010 | Yamazaki et al. |
| 2001/0015626 A1 | 8/2001 | Ozawa |
| 2001/0041270 A1 | 11/2001 | Maruyama et al. |
| 2001/0044077 A1 | 11/2001 | Tan |
| 2002/0018153 A1 | 2/2002 | Kitabayashi |
| 2002/0024493 A1 | 2/2002 | Ozawa et al. |
| 2002/0056842 A1 | 5/2002 | Yamazaki |
| 2002/0066902 A1 | 6/2002 | Takatoku |
| 2002/0071995 A1 | 6/2002 | Montgomery et al. |
| 2002/0075422 A1 | 6/2002 | Kimura et al. |
| 2002/0076626 A1 | 6/2002 | Montgomery et al. |
| 2002/0110940 A1 | 8/2002 | Yamagata et al. |
| 2002/0113248 A1 | 8/2002 | Yamagata et al. |
| 2003/0057862 A1 | 3/2003 | Segawa |
| 2003/0201443 A1 | 10/2003 | Yamagata et al. |
| 2003/0230967 A1 | 12/2003 | Kawamura et al. |
| 2004/0207331 A1 | 10/2004 | Koyama |
| 2004/0265706 A1 | 12/2004 | Montgomery et al. |
| 2005/0118328 A1 | 6/2005 | Seki et al. |
| 2005/0186403 A1 | 8/2005 | Seki et al. |
| 2005/0191562 A1 | 9/2005 | Montgomery et al. |

FOREIGN PATENT DOCUMENTS

| | | | |
|---|---|---|---|
| EP | 0 962 984 A2 | 12/1999 |
| EP | 0 989 778 A1 | 3/2000 |
| EP | 0 993 235 A2 | 4/2000 |
| EP | 1 006 587 A2 | 6/2000 |
| EP | 1 033 765 A2 | 9/2000 |
| EP | 1 063 630 A2 | 12/2000 |
| EP | 1 137 327 A1 | 9/2001 |
| EP | 1 148 553 A2 | 10/2001 |
| EP | 1 338 431 A2 | 8/2003 |
| EP | 1 505 649 A2 | 2/2005 |
| EP | 1 793 650 A2 | 6/2007 |
| JP | 64-057648 | 3/1989 |
| JP | 03-008117 | 1/1991 |
| JP | 03-166737 | 7/1991 |
| JP | 03-259264 | 11/1991 |
| JP | 04-087187 | 3/1992 |
| JP | 04-257826 | 9/1992 |
| JP | 06-177386 | 6/1994 |
| JP | 06-212101 | 8/1994 |
| JP | 06-223974 | 8/1994 |
| JP | 08-006053 | 1/1996 |
| JP | 08-074031 | 3/1996 |
| JP | 08-088089 | 4/1996 |
| JP | 08-120105 | 5/1996 |
| JP | 08-288090 | 11/1996 |
| JP | 09-007770 | 1/1997 |
| JP | 09-134788 | 5/1997 |
| JP | 09-199278 | 7/1997 |
| JP | 09-245965 | 9/1997 |
| JP | 10-193502 A | 7/1998 |
| JP | 10-275858 | 10/1998 |
| JP | 11-024604 | 1/1999 |
| JP | 11-031587 | 2/1999 |
| JP | 11-224781 | 8/1999 |
| JP | 11-271753 | 10/1999 |
| JP | 11-337973 | 12/1999 |
| JP | 2000-030871 A | 1/2000 |
| JP | 2000-049227 | 2/2000 |
| JP | 2000-077191 | 3/2000 |
| JP | 2000-106279 | 4/2000 |
| JP | 2000-172198 | 6/2000 |
| JP | 2000-173778 | 6/2000 |
| JP | 2000-252550 | 9/2000 |
| JP | 2000-260571 | 9/2000 |
| JP | 2000-294378 | 10/2000 |
| JP | 2000-348866 | 12/2000 |
| JP | 2000-353594 | 12/2000 |
| JP | 2001-005426 | 1/2001 |
| JP | 2001-512145 | 8/2001 |
| JP | 2001-291583 | 10/2001 |
| JP | 2001-313164 | 11/2001 |
| JP | 2002-006777 | 1/2002 |
| JP | 2002-033195 | 1/2002 |
| JP | 2002-208477 | 7/2002 |
| JP | 2002-208477 A | 7/2002 |
| JP | 2002-231445 | 8/2002 |
| JP | 2002-231445 A2 | 8/2002 |
| JP | 2002-250881 | 9/2002 |
| JP | 2002-250881 A | 9/2002 |
| JP | 2003-332055 A2 | 11/2003 |
| JP | 2003-347048 A2 | 12/2003 |
| KR | 1999-0088592 | 12/1999 |
| KR | 2001-0003747 | 1/2001 |
| WO | WO 98-12689 A1 | 3/1998 |
| WO | WO 99/48338 | 9/1999 |
| WO | WO 99/48339 | 9/1999 |
| WO | WO-00/63747 A1 | 10/2000 |
| WO | WO 01/74121 | 10/2001 |

OTHER PUBLICATIONS

Austrian Patent Office Search Report (Application No. 200307843-3) Dated: Sep. 14, 2007.
International Search Report (Application No. PCT/JP03/11608) Dated: Feb. 10, 2004.
Written Opinion (Application No. PCT/JP03/11608; PCT6601) Dated: Nov. 2, 2004.
Singapore Search Report for Singapore Patent Application No. 200202665-6, Mailed Jun. 13, 2003.
Miyashita S. et al., "Full Color Displays Fabricated by Ink-Jet Printing", Asia Display / IDW' 01, pp. 1399-1402, 2001.
Intellectual Property Office of Singapore Search Report for Application No. 200307885-4, Dated: Aug. 17, 2006.
Intellectual Property Office of Singapore Search Report for Application No. 200307842-5, Dated: Jul. 21, 2006.
Search Report (Singapore Application No. 200307883-9 Dated Aug. 10, 2006).
First Office Action for Chinese Patent Application No. 200210004596.8, dated Dec. 15, 2006.

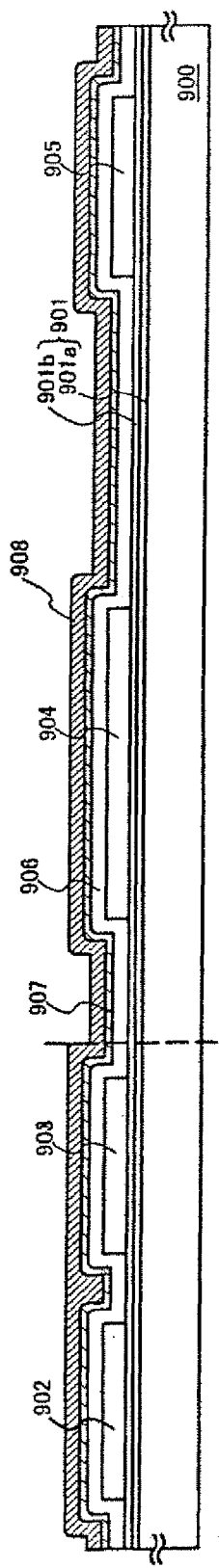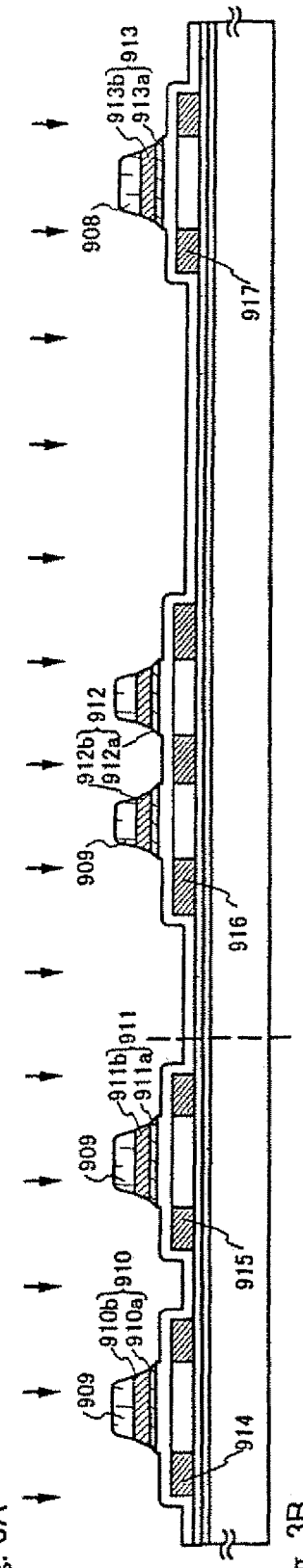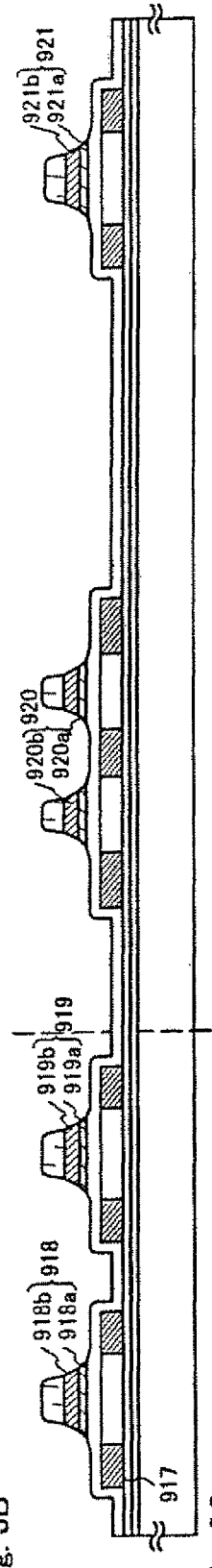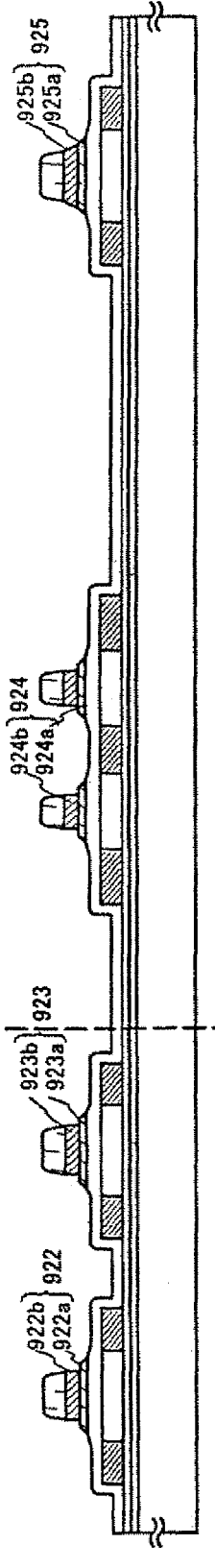

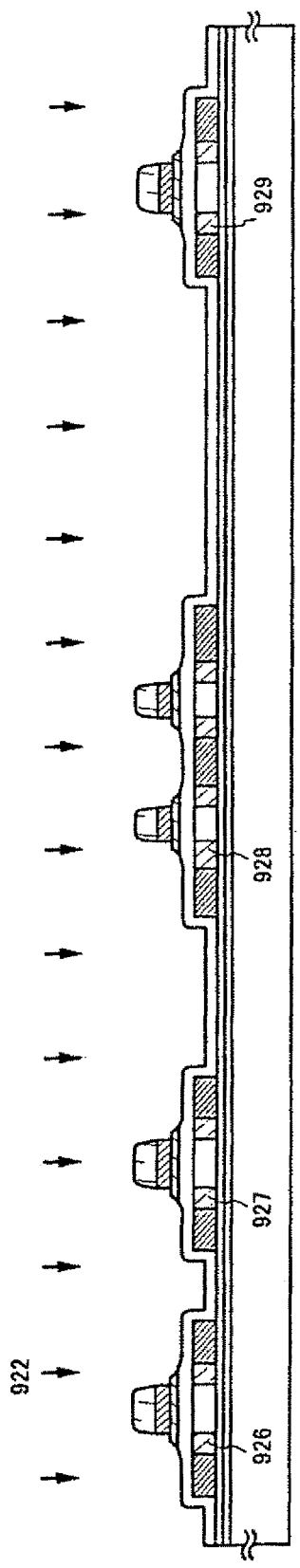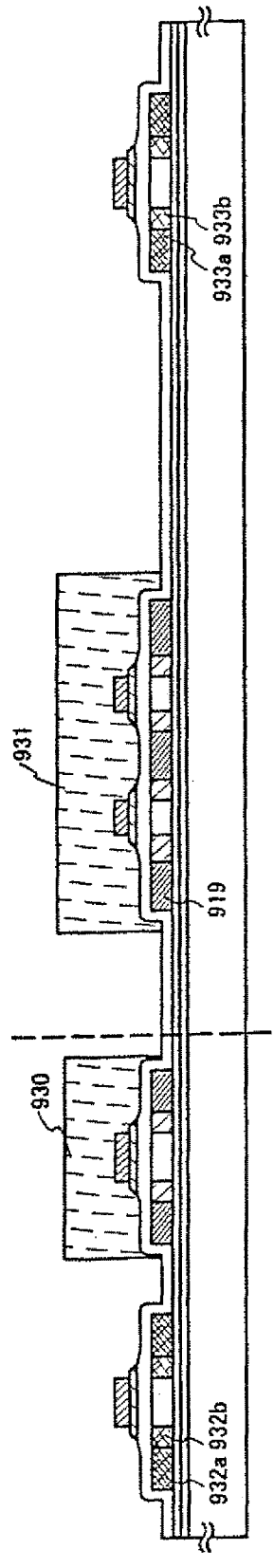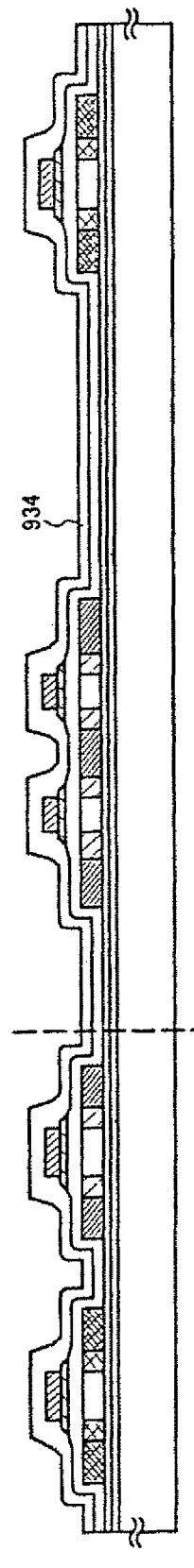

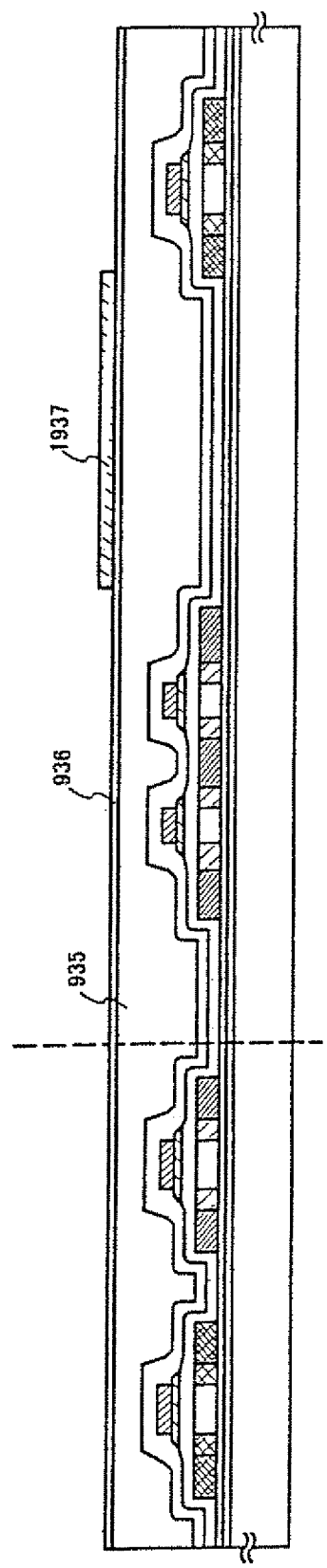
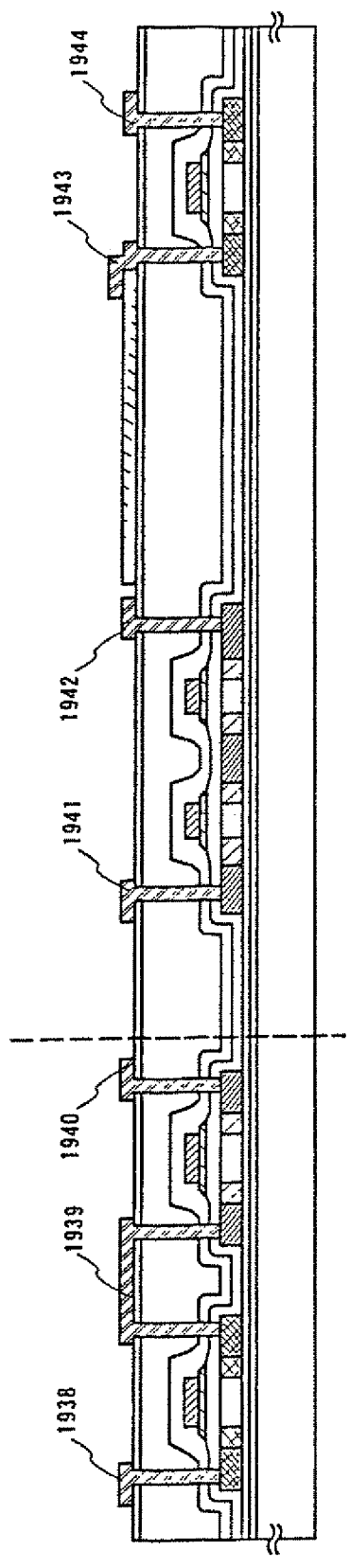
Fig. 18A
Fig. 18B

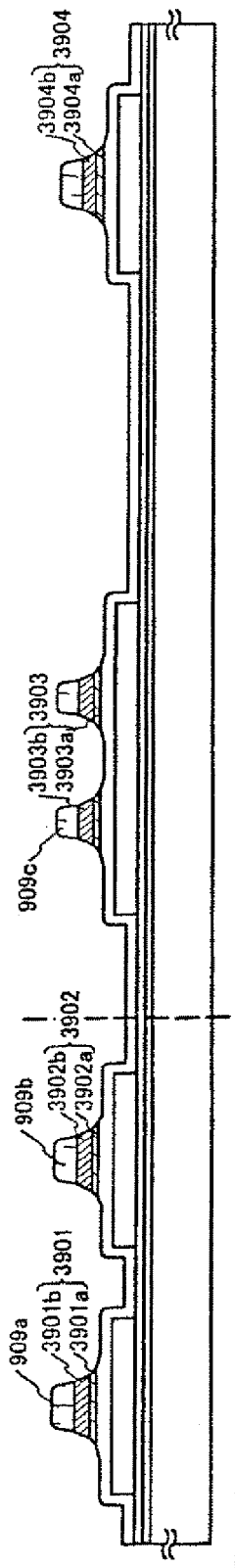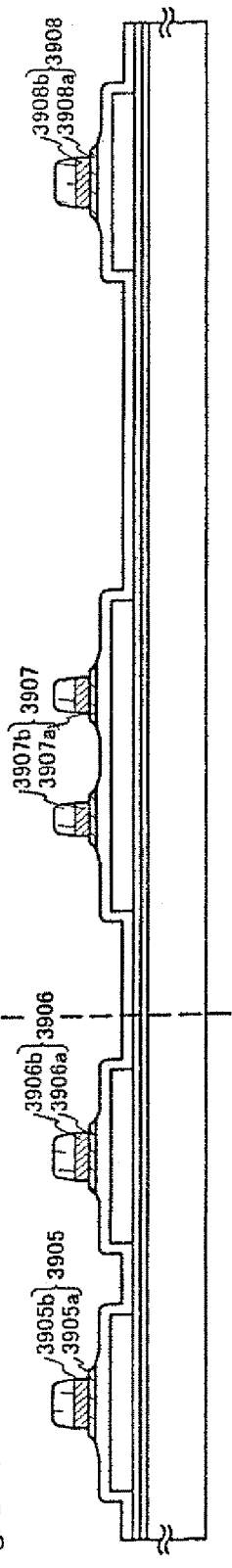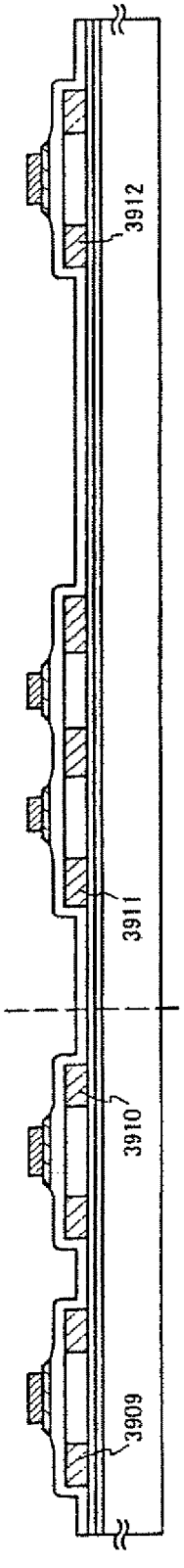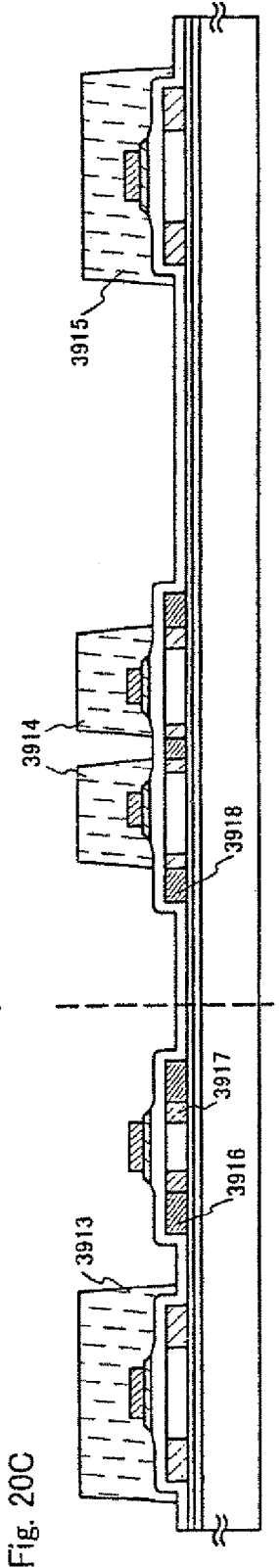
Fig. 20A
Fig. 20B
Fig. 20C
Fig. 20D

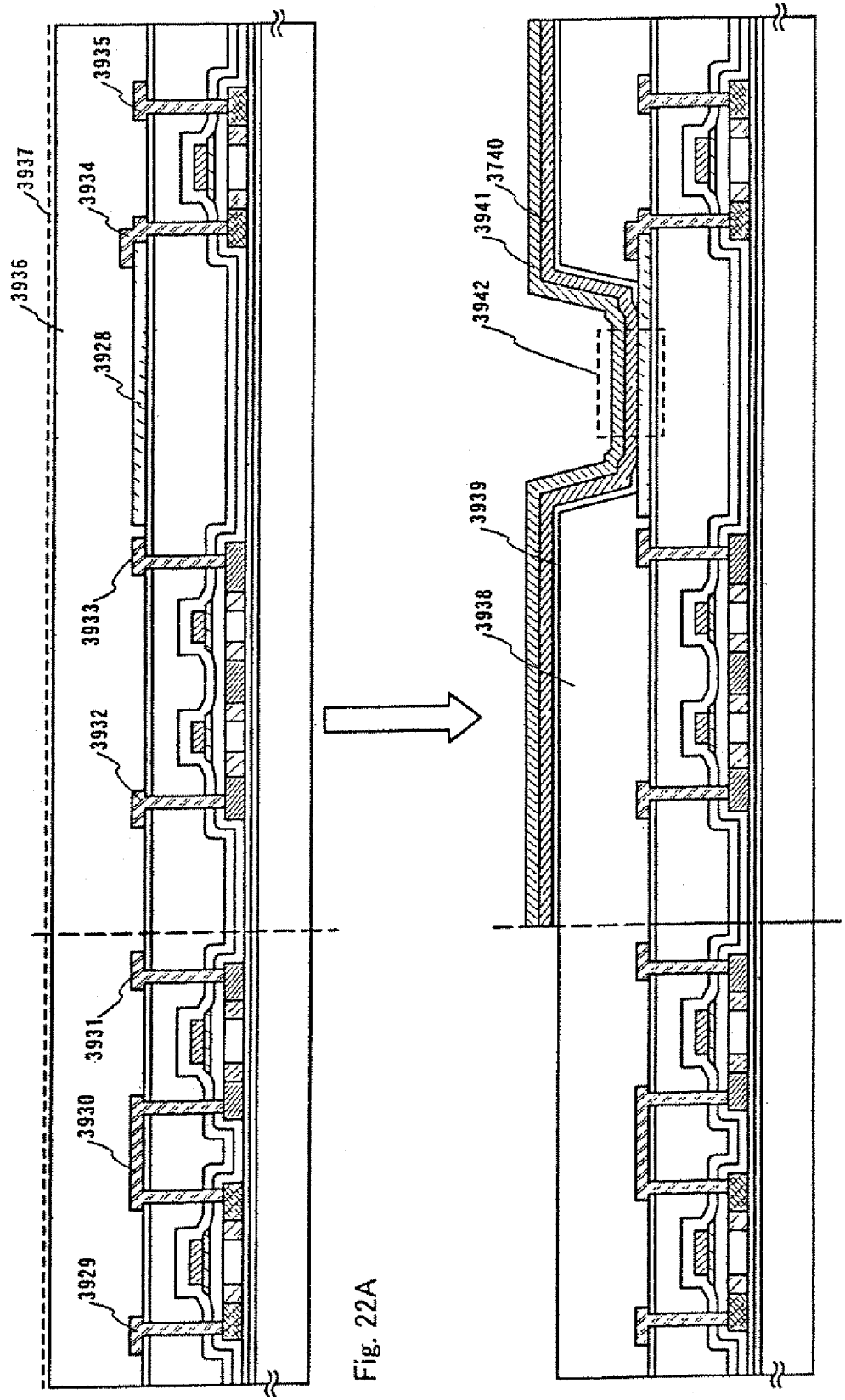

LIGHT EMITTING DEVICE AND METHOD OF MANUFACTURING THE SAME

BACKGROUND OF THE INVENTION

1. Field of the Invention

The present invention relates to a light emitting device with a light emitting element composed of an anode, a cathode, and a film that contains an organic compound capable of emitting light upon application of electric field (the film is hereinafter referred to as organic compound layer), and to a method of manufacturing the light emitting device. Specifically, the present invention relates to a light emitting device using a light emitting element that is lower in drive voltage and longer in element lifetime than conventional ones. A light emitting device in this specification refers to an image display device that uses a light emitting element. Also, the following modules are all included in the definition of the light emitting device: a module obtained by attaching to a light emitting element a connector such as an anisotropic conductive film (FPC: flexible printed circuit), a TAB (tape automated bonding) tape, or a TCP (tape carrier package); a module in which a printed wiring board is provided at an end of a TAB tape or a TCP; and a module in which an IC (integrated circuit) is directly mounted on a light emitting element by the COG (chip on glass) method.

2. Description of the Related Art

Light emitting elements are drawing attention as the next-generation flat panel display elements for their characteristics including being thin and lightweight, fast response, and direct current low voltage driving. Also, being self-luminous and having wide viewing angle give the light emitting elements better visibility. Therefore the light emitting elements are considered as effective elements for display screens of electric appliances and are being actively developed.

It is said that light emitting elements emit light through the following mechanism: a voltage is applied between electrodes that sandwich an organic compound layer, electrons injected from the cathode and holes injected from the anode are re-combined at the luminescent center of the organic compound layer to form molecular excitons, and the molecular excitons return the base state while releasing energy to cause the light emitting element to emit light. Molecular excitons generated in organic compounds take either singlet excitation or triplet excitation. This specification deals with elements that emit light from singlet excitation and elements that emit light from triplet excitation both.

These light emitting elements are classified by driving methods into passive matrix (simple matrix) type and active matrix type. The ones that are attracting attention most are active matrix type elements, for they are capable of displaying images of high definition with the QVGA level number of pixels or more.

An active matrix light emitting device having a light emitting element has an element structure as the one shown in FIG. 2. A TFT 202 is formed on a substrate 201 and an interlayer insulating film 203 is formed on the TFT 202.

On the interlayer insulating film 203, an anode (pixel electrode) 205 is formed to be electrically connected to the TFT 202 through a wiring line 204. A material suitable for the anode 205 is a transparent conductive material having a large work function. An ITO (indium tin oxide) film, a tin oxide ($SnO_2$) film, an alloy film of indium oxide and zinc oxide (ZnO), a semi-transparent gold film, a polyaniline film, etc. are proposed. Of those, the ITO film is used most because it has a band gap of about 3.75 eV and is highly transparent in the range of visible light.

An organic compound layer 206 is formed on the anode 205. In this specification, all the layers that are provided between an anode and a cathode together make an organic compound layer. Specifically, the organic compound layer 206 includes a light emitting layer, a hole injection layer, an electron injection layer, a hole transporting layer, an electron transporting layer, etc. A basic structure of a light emitting element is a laminate of an anode, a light emitting layer, and a cathode layered in this order. The basic structure can be modified into a laminate of an anode, a hole injection layer, a light emitting layer, and a cathode layered in this order, or a laminate of an anode, a hole injection layer, and a light emitting layer, an electron transporting layer, and a cathode layered in this order.

After the organic compound layer 206 is formed, a cathode 207 is formed to complete a light emitting element 209. The cathode is often formed of a metal having a small work function (typically, a metal belonging to Group 1 or 2 in the periodic table). In this specification, such metal (including alkaline metals and alkaline earth metals) is called an alkaline metal.

A bank 208 is formed from an organic resin material to cover the edges of the anode and prevent short circuit between the anode and the cathode at the site.

FIG. 2 shows one pixel and the light emitting element formed therein. The actual pixel portion is provided with a plurality of light emitting elements each structured as shown in FIG. 2 to constitute an active matrix light emitting device.

In the above-described conventional structure for a light emitting device, the interlayer insulating film and the anode (transparent conductive material) formed on the interlayer insulating film have different thermal expansion coefficients. When heat treatment is performed on a structure in which materials having different thermal expansion coefficients are in contact with each other as in this conventional light emitting device structure, it causes a crack in the interface on the side of the material that has the smaller thermal expansion coefficient (the anode, in this case). The anode is an electrode for injecting holes that participate in light emission into the organic compound layer. If there is a crack in the anode, the crack affects generation of holes, reduces the number of holes injected, and even degrades the light emitting element itself. The irregularities of the surface of the anode also affect generation and injection of holes.

Furthermore, the organic compound layer is by nature readily degraded by oxygen and moisture. Despite this fact, organic resin materials such as polyimide, polyamide, and acrylic are frequently used to form the interlayer insulating film and oxygen or other gas released from this interlayer insulating film degrades the light emitting element.

Moreover, the cathode of the light emitting element is formed of an alkaline metal material, such as Al or Mg, which can seriously impair TFT characteristics. An alkaline metal mixed in an active layer of a TFT causes a change in electric characteristic of the TFT, making it impossible to give the TFT a long-term reliability.

In order to avoid impairing TFT characteristics, it is preferable to prevent alkaline metal contamination of an active layer of a TFT by separating a TFT manufacture step processing room (clean room) from a light emitting element manufacture step processing room (clean room). However, another problem arises when moving a substrate between rooms (clean rooms) is added to the manufacture process in order to prevent the alkaline metal contamination; the TFT substrate may be contaminated by dusts or other contaminants in the air, and the TFT element may be damaged by electrostatic discharge.

SUMMARY OF THE INVENTION

An object of the present invention is therefore to provide a high-quality light emitting device having a long-lasting light emitting element that is free from the problems described above because of a structure that allows less degradation than conventional ones, and to provide a method of manufacturing the light emitting device.

The present invention is characterized in that: an interlayer insulating film is formed on a TFT that is formed on an insulator; an insulating film is formed on the interlayer insulating film; an anode is formed to be electrically connected to the TFT through a wiring line; a resin insulating film is formed to cover the anode and the wiring line; the resin insulating film is etched to form a bank; the anode is wiped/cleaned after heat treatment; and an insulating film is formed to cover the anode and the bank.

The insulating film formed between the interlayer insulating film and the anode can suppress the generation of cracking caused by heat treatment in adjoining materials that have different thermal expansion coefficients. The light emitting element thus can have a long lifetime. This insulating film is also capable of preventing gas or moisture released from the interlayer insulating film from reaching the light emitting element. The insulating film may be an inorganic insulating film, or may be a cured film obtained by surface modification through plasma treatment or a DLC film.

By wiping the anode, the irregularities of the surface of the anode can be leveled and dusts on the surface of the anode can be removed.

By forming the insulating film that covers the anode and the bank, an effect of balancing amounts of holes and electrons to be injected to the organic compound layer can be expected.

Another aspect of the present invention is characterized in that: a resin insulating film for forming a bank is formed; the substrate is moved to a processing room where contamination by an alkaline metal or others can be avoided; and the resin insulating film is etched to form the bank.

Anti-electrostatic treatment is conducted after the insulating film for protecting the semiconductor film of the TFT is formed. A first processing room (first clean room) for forming a TFT substrate is separated from a second processing room (second clean room) for forming a light emitting element. Thus, the risk of an alkaline metal mixing in the active layer of the TFT from the alkaline metal material forming the cathode of the light emitting element, such as Al or Mg is lowered. As a result, electric characteristics of the TFT and the long-term reliability thereof can be improved.

The anti-electrostatic film is formed from a material which does not affect the resin insulating film for forming the bank, the anode, and the wiring and can be removed by water washing or like other simple methods. As such the material, a material having conductivity necessary for conducting the anti-electrostatic treatment is suitable (for example, $10^{-8}$ [S/m] or more). An conductive organic material is generally used, for example, the anti-electrostatic film comprising conductive polymer is formed by spin coating, and the anti-electrostatic film comprising conductive low molecular is formed by evaporation. Concretely, polyethylene dioxythiophene (PEDOT), polyaniline (PAni), glycerin fatty acid ester, polyoxyethylene alkyl ether, polyoxyethylene alkylphenyl ether, N,N-Bis(2-hydroxyethyl)alkylamine [alkyl diethanolamine], N-2-Hydroxyethyl-N-2-hydroxyalkylamine [hydroxyalkyl monoethanolamine], polyoxyethylene alkylamine, polyoxyethylene alkylamine fatty acid ester, alkyl diethanolamide, alkyl sultanate, alkylbenzenesulfonate, alkyl phosphate, tetraalkylammonium salt, trialkylbenzylammonium salt, alkyl betaine, alkyl imidazolium betaine, or the like are used. These can be easily removed by water or an organic solvent. In addition, an organic insulating material, such as polyimide, acrylic, polyamide, polyimideamide, or BCB (benzocyclobutene) can be used as the anti-electrostatic film. The anti-electrostatic film formed from the material mentioned above can be applied to all embodiments.

Another aspect of the present invention is characterized by comprising a step of forming a bank and performing plasma treatment on the surface of the bank after heat treatment is performed on the anode for crystallization.

A cured film is formed on the surface of the bank through the surface modification thereof by plasma treatment. This prevents the bank from releasing its moisture and degrading the light emitting element.

BRIEF DESCRIPTION OF THE DRAWINGS

In the accompanying drawings:

FIGS. 3A to 3D are diagrams showing a process of manufacturing a light emitting device;

FIGS. 4A to 4C are diagrams showing a process of manufacturing a light in emitting device;

FIGS. 18A and 18B are diagrams showing a process of manufacturing a light emitting device;

FIGS. 20A to 20D are diagrams showing an example of carrying out a light emitting device manufacture process;

FIGS. 22A and 22B are diagrams showing an example of carrying out a light emitting device manufacture process.

DETAILED DESCRIPTION OF THE PREFERRED EMBODIMENTS

Embodiment Mode

Figure 1A:
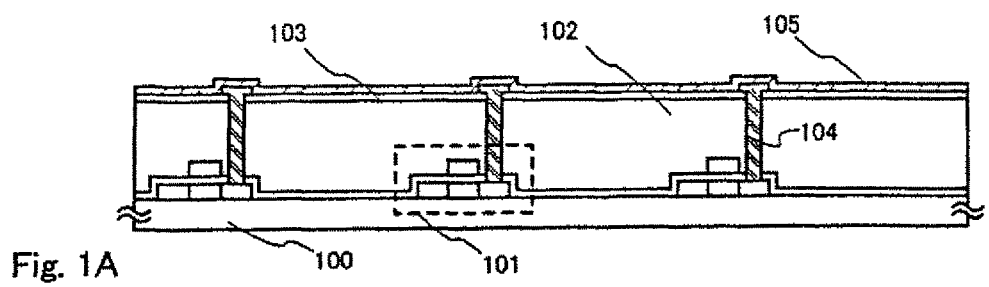
FIGS. 1A to 1E are diagrams showing a method of manufacturing a light emitting device in accordance with an embodiment mode.

A TFT 101 is formed on a substrate 100. The TFT shown here is a TFT for controlling a current flowing into a light emitting element, and is called in this specification as a current controlling TFT 101 (FIG. 1A).

On the current controlling TFT 101, an interlayer insulating film 102 is formed for planarization. The interlayer insulating film 102 is formed from an organic resin material such as polyimide, acrylic, polyamide, polyimideamide, an epoxy resin, or BCB (benzocyclobutene) to have an average thickness of about 1.0 to 2.0 µm. The substrate can be properly leveled by forming the interlayer insulating film 102. Moreover, the interlayer insulating film can reduce parasitic capacitance since organic resin materials are low in dielectric constant in general.

Next, a first insulating film 103 is formed on the interlayer insulating film 102 so that gas released from the interlayer insulating film 102 does not affect the light emitting element. The first insulating film 103 is an inorganic insulating film, typically, a silicon oxide film, a silicon oxynitride film, or a silicon nitride film, or a laminate having the above films in combination. The first insulating film is formed by plasma CVD in which the reaction pressure is set to 20 to 200 Pa, the substrate temperature is set to 300 to 400° C., and the high frequency (13.56 MHz) power density is set to 0.1 to 1.0 W/cm$^2$ for electric discharge. Alternatively, a cured film containing one or more kinds of gas elements selected from the group consisting of hydrogen, nitrogen, halogenated carbon, hydrogen fluoride, and rare gas is formed by plasma treatment performed on the surface of the interlayer insulating film.

Thereafter a resist mask having a desired pattern is formed. A contact hole reaching a drain region of the current controlling TFT 101 is foamed to form a wiring line 104. The wiring line is formed from a Al film or a Ti film as a conductive metal film, or to an alloy film of Al and Ti. The material is deposited by sputtering or vacuum evaporation to form a film, and the obtained film is patterned into a desired shape.

A transparent conductive film 105 is formed next to serve as an anode of the light emitting layer. The transparent conductive film 105 is typically formed from indium tin oxide (ITO), or from indium oxide with 2 to 20% of zinc oxide (ZnO) mixed therein.

Figure 1B:
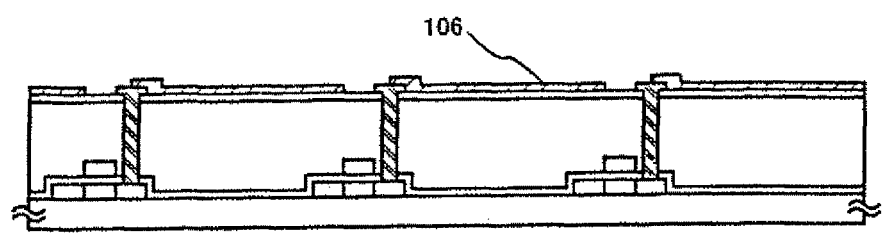
Figure 1C:
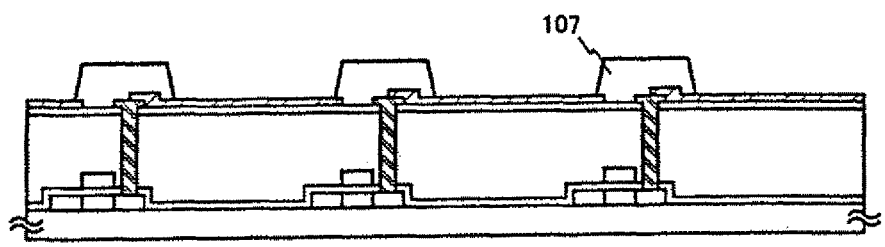
Figure 1D:
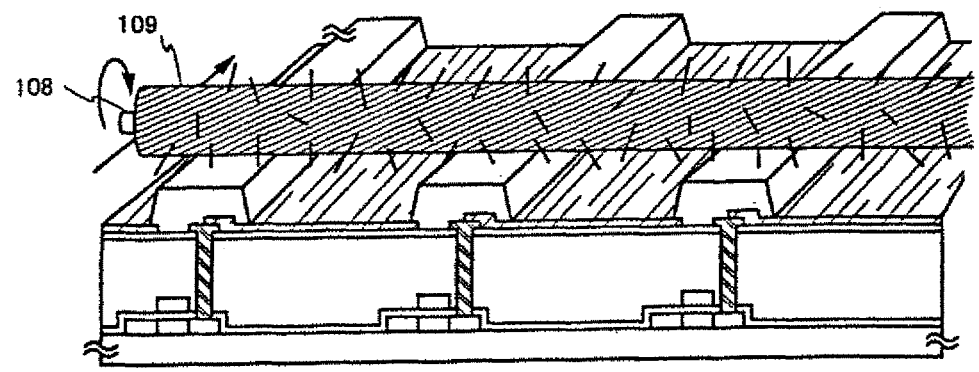
Figure 1E:
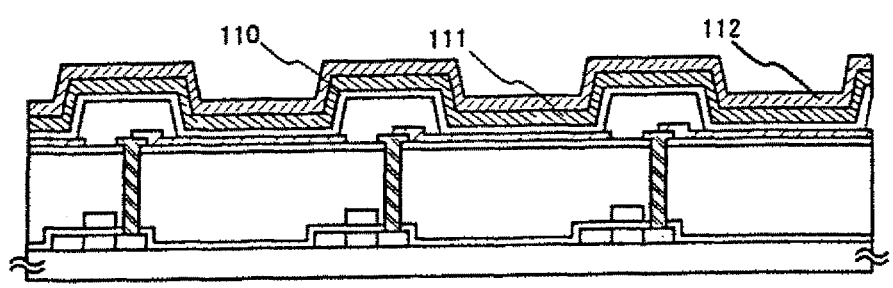
Figure 2:
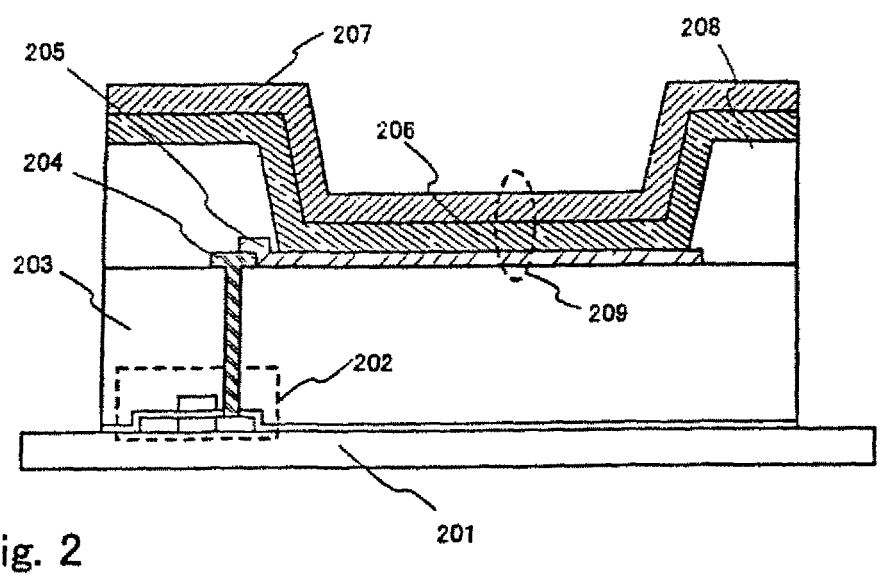
FIG. 2 is a diagram showing an example of a conventional light emitting device.

The anode is formed by etching the transparent conductive film 105. Thereafter, a bank 107 is formed and heat treatment is conducted at 230 to 350° C. In this specification, an insulating film which has an opening above the anode and which covers the edges of the anode is called as a bank (FIGS. 1B and 1C)

The surface of the anode 106 is wiped using a PVA (polyvinyl alcohol)-based porous substance along with a washing liquid to level the surface of the anode 106 and remove dusts therefrom. In this specification, wiping an anode surface with a PVA (polyvinyl alcohol)-based porous substance to level the surface and remove dusts therefrom is expressed as wiping.

After wiping the surface of the anode, a second insulating film 110 is formed. An organic compound layer 111 and then a cathode 112 are formed on the second insulating film 110. The second insulating film 110 is a polyimide, polyamide, acrylic, or other organic resin insulating film formed by spin coating to a thickness of 1 to 5 nm.

The organic compound layer 111 is a laminate that has, in addition to a light emitting layer, a hole injection layer, a hole transporting layer, a hole blocking layer, an electron transporting layer, an electron injection layer, a buffer layer, etc. in combination. The thickness of the organic compound layer 111 is preferably about 10 to 400 nm.

The cathode 112 is formed by evaporation after the organic compound layer 111 is formed. The material of the cathode 112 is MgAg or a Al—Li alloy (alloy of aluminum and lithium). Alternatively, the cathode may be a film formed by co-evaporation of an element belonging to Group 1 or 2 in the periodic table and aluminum. The thickness of the cathode 112 is preferably about 80 to 200 nm.

Figure 14:
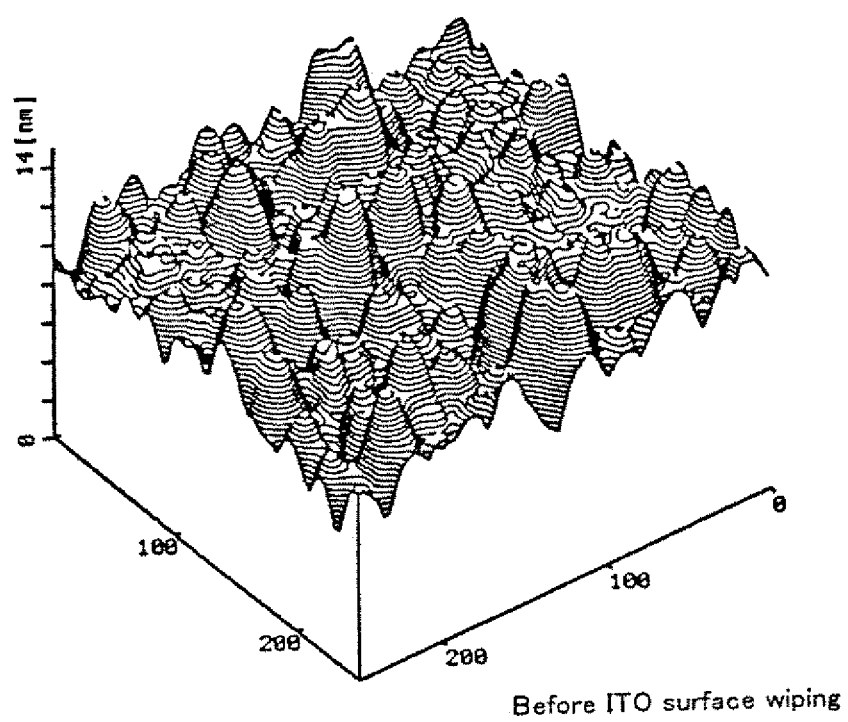
FIG. 14 is a diagram showing results of AFM measurement.
Figure 15:
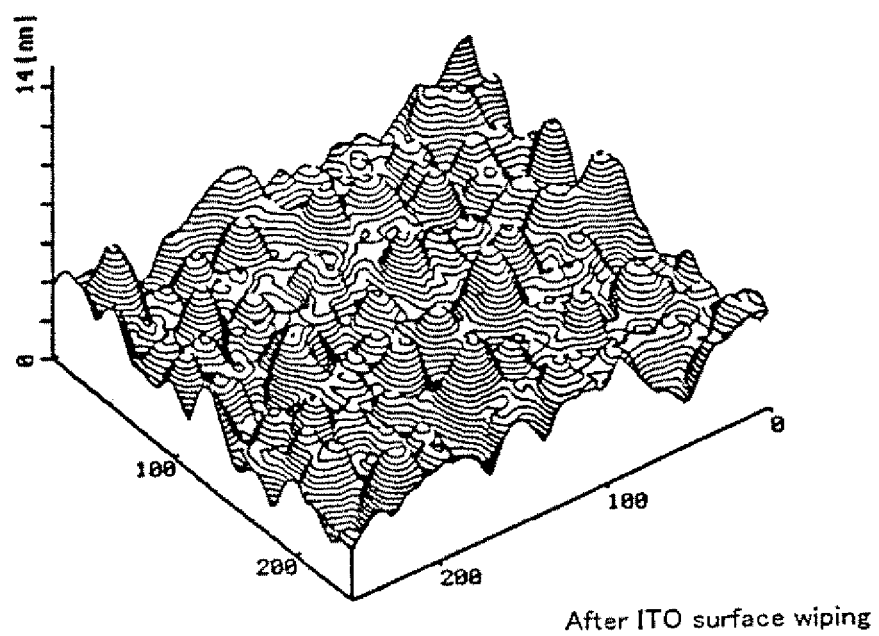
FIG. 15 is a diagram showing results of AFM measurement.
Figure 16:
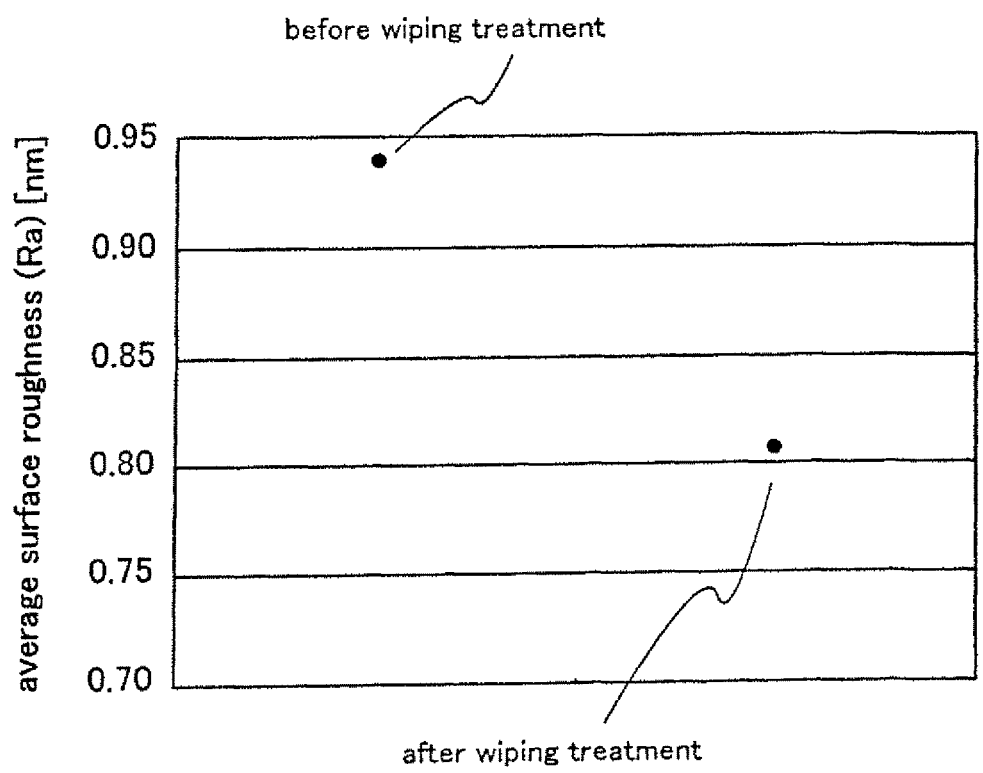
FIG. 16 is a diagram showing results of AFM measurement.

The state of the surface of the transparent conductive film after wiping treatment is observed by using an atomic force microscope (AFM), and the results are shown in FIGS. 14 to 16.

The surface observation in this embodiment uses as a measurement surface an ITO film that is formed to a thickness of 110 nm on a glass substrate and crystallized by heat treatment at 250° C.

FIGS. 14 and 15 show the irregularities of the substrate surface observed by AFM. Shown in FIG. 14 are results of observing a measurement surface before wiping treatment whereas FIG. 15 shows results of observing the measurement surface after wiping treatment.

FIG. 16 shows the average surface roughness (Ra) before and after wiping treatment using Bellclean (a product of Ozu Corporation) as a PVA-based porous material for wiping. The average surface roughness here is expanded three-dimensionally so that the center line average height defined by JIS B0601 can be applied with respect to the surface to be observed. From the results, the average surface roughness on the measurement surface is reduced and the levelness is increased after the wiping treatment.

Embodiment 1

This embodiment gives a description about a light emitting element that is manufactured using the present invention. Described here with reference to FIGS. 3A to 6B is an example of a method of manufacturing TFTs for a pixel portion and TFTs (an n-channel TFT and a p-channel TFT) for a driving circuit at the same time on the same substrate. The pixel portion has the light emitting element of the present invention. The driving circuit is provided in the periphery of the pixel portion.

First, a glass substrate 900 is prepared. In this embodiment, barium borosilicate glass, typical example of which is Corning #7059 glass or #1737 glass (product of Corning Incorporated), or alumino borosilicate glass is usable as the substrate 900. The substrate 900 can be any light-transmissive substrate, and a quartz substrate may also be used. A plastic substrate may be employed if it has a heat resistance against the process temperature of this embodiment.

Next, as shown in FIG. 3A, a base insulating film 901 is formed on the substrate 900 from an insulating film such as a silicon oxide film, a silicon nitride film, or a silicon oxynitride film. In this embodiment, the base insulating film 901 has a two-layer structure. However, a single layer or more than two layers of the insulating films listed above may be used as the base insulating film. The first layer of the base insulating film 901 is a silicon oxynitride film 901a formed to a thickness of 10 to 200 nm (preferably 50 to 100 nm) by plasma CVD using as reaction gas $SiH_4$, $NH_3$, and $N_2O$. The silicon oxynitride film 901a (composition ratio: Si=32%, O=27%, N=24%, H=17%) formed in this embodiment has a thickness of 50 nm. The second layer of the base insulating film 901 is a silicon oxynitride film 901b formed to a thickness of 50 to 200 nm (preferably 100 to 150 nm) by plasma CVD using as reaction gas SiH$_4$ and N$_2$O. The silicon oxynitride film 901*b* (composition ratio: Si=32%, O=59%, N=7%, H=2%) formed in this embodiment has a thickness of 100 nm.

On the base insulating film 901, semiconductor layers 902 to 905 are formed. The semiconductor layers 902 to 905 are fanned by patterning into a desired shape a crystalline semiconductor film that is obtained by forming a semiconductor film with an amorphous structure through a known method (sputtering, LPCVD, plasma CVD, or the like) and then subjecting the film to known crystallization treatment (e.g., laser crystallization, thermal crystallization, or thermal crystallization using nickel or other catalysts). The semiconductor layers 902 to 905 are each 25 to 80 nm in thickness (preferably 30 to 60 nm). The material of the crystalline semiconductor film is not limited, but silicon or a silicon germanium (Si$_X$Ge$_{1-X}$ (X=0.0001 to 0.02)) alloy is preferable. In this embodiment, an amorphous silicon film with a thickness of 55 nm is formed by plasma CVD and then a solution containing nickel is held to the top face of the amorphous silicon film. The amorphous silicon film is next subjected to dehydrogenation (at 500° C., for an hour), then to thermal crystallization (at 550° C., for four hours), and then to laser annealing treatment for improvement of crystallinity to obtain a crystalline silicon film. Patterning treatment using photolithography is conducted on this crystalline silicon film to form the semiconductor layers 902 to 905.

The semiconductor layers 902 to 905 may be doped with a minute amount of impurity element (boron or phosphorus) in order to control the threshold of the TFTs after the formation of the semiconductor layers 902 to 905.

If laser crystallization is used to form the crystalline semiconductor film, a pulse oscillating type or continuous wave excimer laser, YAG laser, or YVO$_4$ laser can be employed. Laser light emitted by one chosen out of these lasers is preferably collected into a linear beam by an optical system before irradiating the semiconductor film. Though conditions of crystallization can be set suitably by an operator, there are some preferred conditions. When an excimer laser is used, preferable conditions include setting the pulse oscillation frequency to 300 Hz, and the laser energy density to 100 to 400 mJ/cm$^2$ (typically, 200 to 300 mJ/cm$^2$). When a YAG laser is used, preferable conditions include using the second harmonic thereof, and setting the pulse oscillation frequency to 30 to 300 kHz and the laser energy density to 300 to 600 mJ/cm$^2$ (typically, 350 to 500 mJ/cm$^2$). The laser light is collected into a linear beam having a width of 100 to 1000 μm, 400 μm, for example, to irradiate the entire surface of the substrate with the beam. In the irradiation, the overlap ratio of the linear laser light is set to 50 to 90%.

Next, a gate insulating film 906 is formed to cover the semiconductor layers 902 to 905. The gate insulating film 906 is formed from an insulating film containing silicon by plasma CVD or sputtering to a thickness of 40 to 150 nm. This embodiment uses a silicon oxynitride film (composition ratio: Si=32%, O=59%, N=7%, H=2%) formed by plasma CVD to a thickness of 110 nm. The gate insulating film is not limited to the silicon oxynitride film, of course, but may be a single layer or a laminate of other insulating films containing silicon.

When a silicon oxide film is used for the gate insulating film, the film is formed by plasma CVD in which TEOS (tetraethyl orthosilicate) and O$_2$ are mixed, the reaction pressure is set to 40 Pa, the substrate temperature is set to 300 to 400° C., and, the high frequency (13.56 MHz) power density is set to 0.5 to 0.8 W/cm$^2$ for electric discharge. The silicon oxide film thus formed can provide excellent characteristics as the gate insulating film when the film receives subsequent thermal annealing at 400 to 500° C.

A heat-resistant conductive layer 907 for forming a gate electrode is formed on the gate insulating film 906 to a thickness of 200 to 400 nm (preferably 250 to 350 nm). The heat-resistant conductive layer 907 may be a single layer or a laminate of two, three, or more layers if necessary. The heat-resistant conductive layer may be a film containing an element selected from the group consisting of Ta, Ti, and W. Alternatively, the heat-resistant conductive layer may be an alloy film containing one of the elements listed above and other elements, or an alloy film containing a combination of the elements listed above. Sputtering or CVD is used to form the heat-resistant conductive layer. In order to reduce the resistance of the layer, the concentration of impurities contained in the layer should be lowered and the oxygen concentration in particular is preferably reduced to 30 ppm or less. In this embodiment, a W film is formed to a thickness of 300 nm. The W film may be formed by sputtering with W as the target, or by thermal CVD using tungsten hexafluoride (WF$_6$). In either case, the W film has to have a low resistivity in order to use the W film as a gate electrode. A desirable resistivity of the W film is 20 μΩcm or lower. The resistivity of the W film can be reduced by increasing the crystal grain size but, if there are too many impurity elements such as oxygen in the W film, crystallization is inhibited to raise the resistivity. Accordingly, when the W film is formed by sputtering, a W target with a purity of 99.9 to 99.9999% is used and a great care is taken not to allow impurities in gas phase to mix in the W film that is being formed. As a result, the W film can have a resistivity of 9 to 20 μΩcm.

Sputtering can also be used to form a Ta film for the heat-resistant conductive layer 907. The Ta film is formed by using Ar as sputtering gas. If an appropriate amount of Xe or Kr is added to the sputtering gas, the internal stress of the obtained Ta film is eased to prevent the Ta film from peeling off. The resistivity of a Ta film in a phase is about 20 μΩcm and is usable as a gate electrode. On the other hand, the resistivity of a Ta film in β phase is about 180 μΩcm and is not suitable for a gate electrode. A Ta film in α phase can readily be obtained by forming, as a base of a Ta film, a TaN film that has a crystal structure approximate to that of the α phase. Though not shown in the drawings, it is effective to form a silicon film doped with phosphorus (P) to a thickness of about 2 to 20 nm under the heat-resistant conductive layer 907. This improves adherence to the conductive film to be formed thereon and prevents oxidization. At the same time, the silicon film prevents a minute amount of alkaline metal element contained in the heat-resistant conductive layer 907 and 908 from diffusing into the first shape gate insulating film 906. Whatever material is used, a preferable resistivity range for the heat-resistant conductive layer 907 is 10 to 50 μΩcm.

In this embodiment, a TaN film is used for the first conductive film 907 and a W film is used for the second conductive film 908 (FIG. 3A).

Next, resist masks 909 are formed using the photolithography technique. Then first etching treatment is carried out. The first etching treatment is conducted under first etching conditions and second etching conditions.

In this embodiment, an ICP etching apparatus is used, Cl$_2$, CF$_4$, and O$_2$ are used as etching gas, the ratio of gas flow rate thereof is set to 25/25/10, and RF (13.56 MHz) power of 3.2 W/cm$^2$ is given at a pressure of 1 Pa to generate plasma. RF (13.56 MHz) power of 224 mW/cm$^2$ is also given to the substrate side (sample stage) so that substantially negative self-bias voltage is applied thereto. The W film is etched under the first etching conditions. The first etching conditions are then switched to the second etching conditions without removing the resist masks. Under the second etching conditions, $CF_4$ and $Cl_2$ are used as etching gas, the ratio of gas flow rate thereof is set to 30/30 SCCM, and RF (13.56 MHz) power is given at a pressure of 1 Pa to generate plasma. RF (13.56 MHz) power of 20 W is also given to the substrate side (sample stage) so that substantially negative self-bias voltage can be applied.

Conductive films 910 to 913 having a first taper shape are formed through the first etching treatment. The angle of the tapered portions of the conductive layers 910 to 913 is set to 15 to 30°. In order to etch the films without leaving any residue, the etching time is prolonged by about 10 to 20% for over-etching. The selective ratio of the silicon oxynitride film (the gate insulating film 906) to the W film is 2 to 4 (typically, 3), and hence the exposed surface of the silicon oxynitride film is etched by about 20 to 50 nm through the over-etching treatment (FIG. 3B).

Then first doping treatment is performed to dope the semiconductor layers with an impurity element of one conductivity type. An impurity element for giving the n type conductivity is used in this doping step without removing the resist masks 909. The semiconductor layers 902 to 905 are partially doped with the impurity element using the first taper shape conductive layers 910 and 913 as masks, whereby first n type impurity regions 914 to 917 are formed in a self-aligning manner. Used as the impurity element for imparting the n type conductivity is a Group 15 element in the periodic table, typically phosphorus (P) or arsenic (As). The doping here uses phosphorus and ion doping. The concentration of the impurity element for imparting the n type conductivity is $1 \times 10^{20}$ to $1 \times 10^{21}$ atoms/cm$^3$ in the first n type impurity regions 914 to 917 (FIG. 3B).

Second etching treatment is then conducted without removing the resist masks. The second etching treatment is carried out under third etching conditions and fourth etching conditions. In the second etching treatment, similar to the first etching treatment, the ICP apparatus is employed, $CF_4$ and $Cl_2$ are used as etching gas, the ratio of flow rate thereof is set to 30/30 SCCM, and RF (13.56 MHz) power is given at a pressure of 1 Pa to generate plasma. RF (13.56 MHz) power of 20 W is also given to the substrate side (sample stage) so that a substantially negative self-bias voltage is applied thereto. Formed under the third etching conditions are conductive films 918 to 921 where the W film and the TaN film are etched to the same degree (FIG. 3C).

While leaving the resist masks in their places, the etching conditions are changed to the fourth etching conditions. Under the fourth etching conditions, a mixture of $CF_4$, $Cl_2$, and $O_2$ is used as etching gas, and RF (13.56 MHz) power is given at a pressure of 1 Pa to generate plasma. RF (13.56 MHz) power of 20 W is also given to the substrate side (sample stage) so that substantially negative self-bias voltage is applied thereto. The W film is etched under the fourth etching conditions to form second shape conductive films 922 to 925 (FIG. 3D).

Then second doping step is carried out (in which the semiconductor layers are doped with an n type impurity element through the second shape first conductive films 922a to 925a). As a result, second n type impurity regions 926 to 929 are respectively formed on the side of the channel formation regions that are in contact with the first n type impurity regions 914 to 917. The concentration of the impurity in each second n type impurity region is set to $1 \times 10^{16}$ to $1 \times 10^{19}$ atoms/cm$^3$. In the second doping step, the semiconductor layers are doped with the n type impurity element also through the tapered portions of the first layer second shape conductive films 922a to 925a. In this specification, portions of the second n type impurity regions that overlap the first layer second shape conductive films 922a to 925a are called Lov ('ov' stands for 'overlap') regions whereas portions of the second n type impurity regions that do not overlap the first layer second shape conductive films 922a to 925a are called Loff ('off' stands for 'offset') regions (FIG. 4A).

As shown in FIG. 4B, impurity regions 932 (932a and 932b) and 933 (933a and 933b) are formed in the semiconductor layers 902 and 905, respectively, which are to serve as active layers of p-channel TFTs. The conductivity type of the impurity regions 932 and 933 is reverse to the one conductivity type. The impurity regions 932 and 933 too are formed in a self-aligning manner by doping the semiconductor layers with an impurity element that gives the p type conductivity while using the second conductive layers 922 and 925 as masks. Prior to this doping, resist masks 930 and 931 are formed to cover the entire surfaces of the semiconductor layers 903 and 904 that are to serve as active layers of n-channel TFTs. The p type impurity regions 932 and 933 are foamed by ion doping using diborane ($B_2H_6$). The concentration of the impurity for imparting the p type conductivity is set to $2 \times 10^{20}$ to $2 \times 10^{21}$ atoms/cm$^3$ in each of the p type impurity regions 932 and 933.

At a closer look, the p type impurity regions 932 and 933 contain the impurity element that gives the n type conductivity. However, the p type impurity regions 932 and 933 have no problem in functioning as a source region and a drain region of p-channel TFTs if they are doped with the impurity element for imparting the p type conductivity in a concentration 1.5 to 3 times higher than the concentration of the impurity element that gives the n type conductivity.

Thereafter, a first interlayer insulating film 934 is formed on the second shape conductive layers 922 to 925 and the gate insulating film 906 as shown in FIG. 4C. The first interlayer insulating film 934 is a silicon oxide film, a silicon oxynitride film, or a silicon nitride film, or a laminate having the above films in combination. In any case, the first interlayer insulating film 934 is formed from an inorganic insulating material. The thickness of the first interlayer insulating film 934 is set to 100 to 200 nm. If a silicon oxide film is used for the first interlayer insulating film 934, the film is formed by plasma CVD in which TEOS and $O_2$ are mixed, the reaction pressure is set to 40 Pa, the substrate temperature is set to 300 to 400° C., and the high frequency (13.56 MHz) power density is set to 0.5 to 0.8 W/cm$^2$ for electric discharge. If a silicon oxynitride film is used for the first interlayer insulating film 934, the film may be formed by plasma CVD from $SiH_4$, $N_2O$, and $NH_3$, or from $SiH_4$ and $N_2O$. The film formation conditions in this case include setting the reaction pressure to 20 to 200 Pa, the substrate temperature to 300 to 400° C., and the high frequency (60 MHz) power density to 0.1 to 1.0 W/cm$^2$. The first interlayer insulating film 934 may be a silicon oxynitride hydrate film formed from $SiH_4$, $N_2O$, and $H_2$. A silicon nitride film as the first interlayer insulating film can be formed similarly by plasma CVD from $SiH_4$ and $NH_3$.

Then an activation step is conducted to activate the impurity elements that are used to dope the semiconductor layers in different concentrations and give them the n type or p type conductivity. The activation step is achieved by thermal annealing using an annealing furnace. Laser annealing or rapid thermal annealing (RTA) may be employed instead. Thermal annealing is conducted in a nitrogen atmosphere with the oxygen concentration being 1 ppm or less, preferably 0.1 ppm or less, at a temperature of 400 to 700° C., typically 500 to 600° C., and heat treatment in this embodiment is conducted at 550° C. for four hours. If a plastic substrate that has low heat-resistance is used as the substrate 900, laser annealing is preferred.

In this heat treatment step, the catalytic element (nickel) used in the step of crystallizing the semiconductor layers is moved (gettered) to the first n type impurity regions heavily doped with a Group 15 element in the periodic table that has a gettering effect (phosphorus is used in this embodiment). As the result of gettering, the concentration of the catalytic element is reduced in the channel formation regions.

The activation step is followed by a step of hydrogenating the semiconductor layers through heat treatment at 300 to 450° C. for 1 to 12 hours while changing the atmosphere gas to an atmosphere containing 3 to 100% hydrogen. This step is for terminating $10^{16}$ to $10^{18}$/cm$^3$ of the semiconductor layers by thermally excited hydrogen. Other usable hydrogenating methods include plasma hydrogenation (using hydrogen excited by plasma). Whichever method is used, the defect density of the semiconductor layers 902 to 905 is desirably reduced to $10^{16}$/cm$^3$ or lower. To achieve this, the semiconductor layers are doped with 0.01 to 0.1 atomic % hydrogen.

A second interlayer insulating film 935 is formed to an average thickness of 1.0 to 2.0 μm from an organic insulating material. The second interlayer insulating film may be formed of an organic resin material such as polyimide, acrylic, polyamide, polyimideamide, or BCB (benzocyclobutene). For instance, when polyimide of the type that is thermally polymerized after applied to a substrate is used, the film is formed by baking in a clean oven at 300° C. If the second interlayer insulating film is formed of acrylic, two-pack type is employed. The main material is mixed with the curing agent, the mixture is applied to the entire surface of the substrate using a spinner, the substrate is pre-heated on a holt plate at 80° C. for 60 seconds, and then the substrate is baked in a clean oven at 250° C. for 60 minutes to form the film.

Being formed of an organic insulating material, the second interlayer insulating film 935 is capable of leveling the surface properly. Moreover, the interlayer insulating film can reduce parasitic capacitance since organic resin materials are low in dielectric constant in general. However, organic resin materials are hygroscopic and are not suitable as a protective film. Therefore, as in this embodiment, the second interlayer insulating film is used in combination with the first interlayer insulating film 934 that is formed from a silicon oxide film, a silicon oxynitride film, or a silicon nitride film.

The second interlayer insulating film 935 formed from an organic insulating material may release moisture and gas. Light emitting elements are known to be easily degraded by moisture or gas (oxygen). In fact, in a light emitting device that uses an organic resin insulating film to form an interlayer insulating film, it is conceivable that its light emitting element is easily degraded by moisture and oxygen released from the organic resin insulating film due to heat generated during the light emitting device is in operation. Therefore, a first insulating film 936 is formed on the second interlayer insulating film 935 that is formed from an organic insulating material.

A silicon oxide film, a silicon oxynitride film, a silicon nitride film, or the like is used for the first insulating film 936. The first insulating film 936 is formed here by sputtering or plasma CVD. The first insulating film 936 may be formed after contact holes are formed.

A resist mask having a given pattern is then formed to form contact holes reaching the impurity regions that are formed in the semiconductor layers to serve as source regions or drain regions. The contact holes are formed by dry etching. In this case, a mixture of $CF_4$ and $O_2$ is used as etching gas to etch the first insulating film 936 first. The etching gas is then changed to a mixture of $CF_4$, $O_2$, and He to etch the second interlayer insulating film 935 that is formed from an organic resin material. Then the etching gas is switched back to $CF_4$ and $O_2$ to etch the first interlayer insulating film 934. The etching gas is further changed to $CHF_3$ in order to enhance the selective ratio with the semiconductor layers, and the gate insulating film 906 is etched. The contact holes are thus obtained.

A metal conductive film is formed by sputtering or vacuum evaporation and patterned using a mask. The film is then etched to form wiring lines 937 to 943. Though not shown in the drawings, the wiring lines in this embodiment are formed from a laminate of a Ti film with a thickness of 50 nm and an alloy film (Al—Ti alloy film) with a thickness of 500 nm.

Figure 5A:
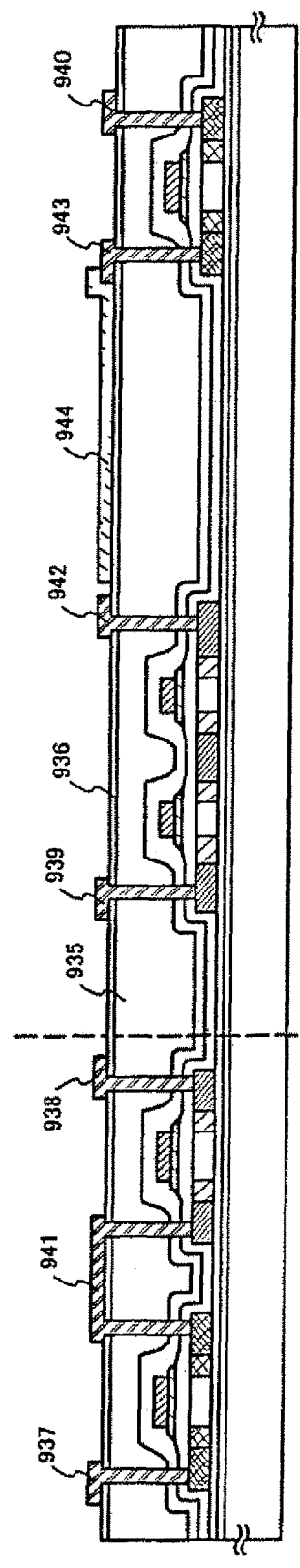
FIGS. 5A to 5C are diagrams showing a process of manufacturing a light emitting device.

A transparent conductive film is formed thereon to a thickness of 80 to 120 nm. The film is then etched to form an anode 944 (FIG. 5A). The transparent conductive film used in this embodiment is an indium tin oxide (ITO) film or a film obtained by mixing 2 to 20% of zinc oxide (ZnO) with indium oxide.

The anode 944 is formed to come in contact and overlap with the drain wiring line 943, whereby the anode is electrically connected to the drain region of the current controlling TFT (FIG. 5A). The anode 944 at this point may receive heat treatment at 180 to 350° C.

Figure 5B:
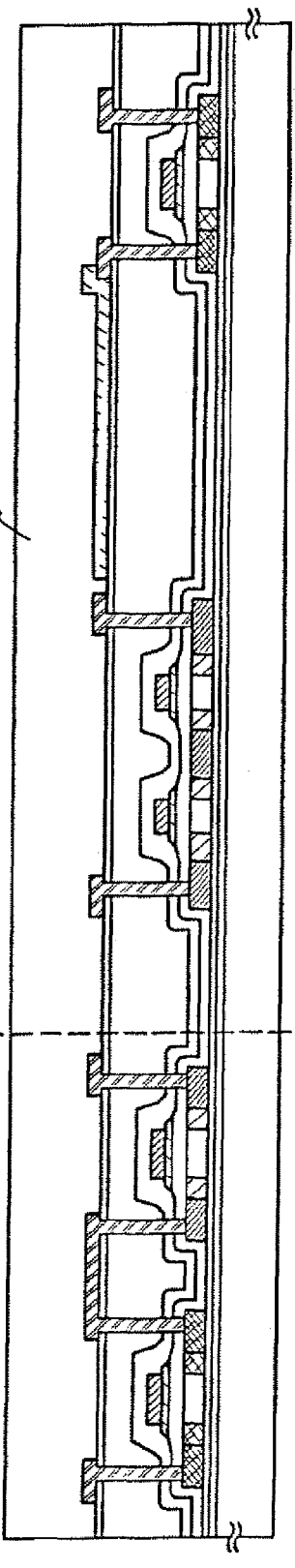
Figure 5C:
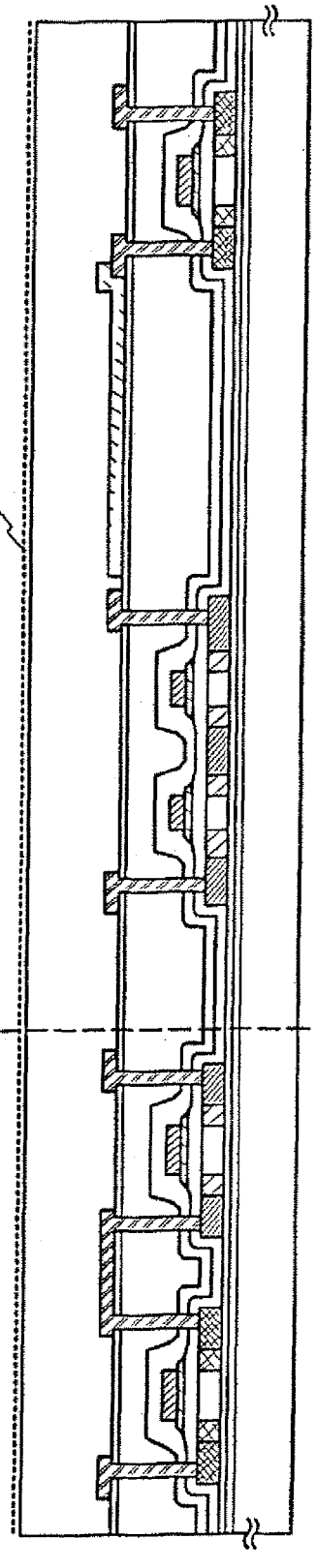

Next, a third interlayer insulating film 945 is formed on the anode 944 as shown in FIG. 5B. At this point, the substrate may be moved to a processing room (clean room) for forming a light emitting element. In order to avoid contamination or breakage of the TFT substrate by dusts in the air, a very thin film 946 having an anti-electrostatic effect (hereinafter referred to as anti-electrostatic film) is formed on the third interlayer insulating film 945. The anti-electrostatic film 946 is formed from a material that can be removed by water washing (FIG. 5C). Instead of forming an anti-electrostatic film, the substrate may be stored in an anti-electrostatic carry case. Before changing processing rooms, the TFT substrate that has finished the steps above may be subjected to operation testing.

Figure 6A:
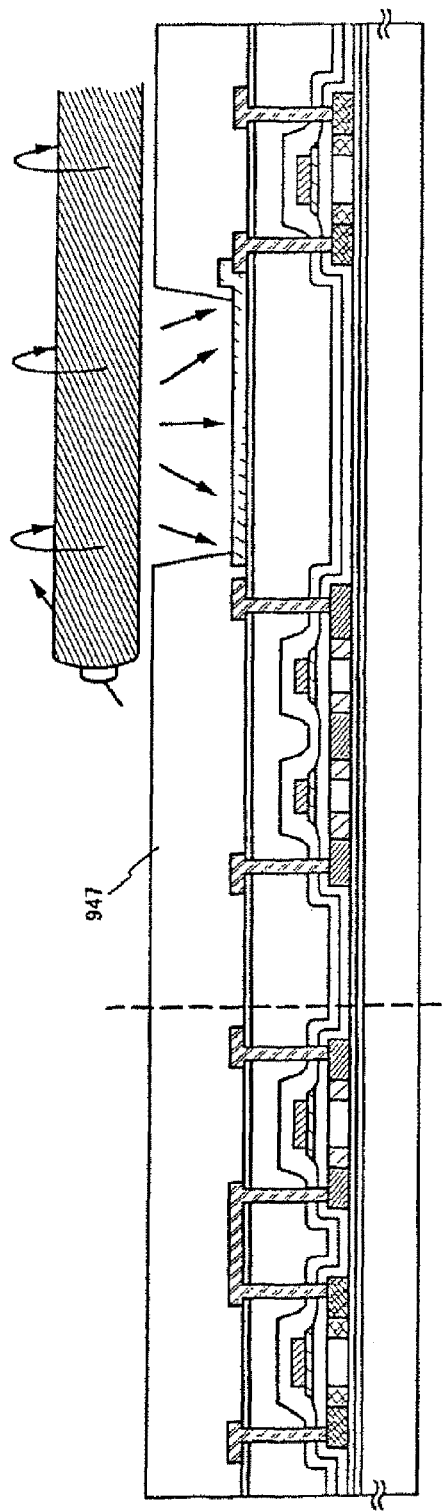
FIGS. 6A and 6B are diagrams showing a process of manufacturing a light emitting device.

When the TFT substrate is brought into the processing room (clean room) for forming a light emitting element, the anti-electrostatic film 946 is removed by water washing. Then the third interlayer insulating film 945 is etched to form a bank 947 having an opening at a position that coincides with the pixel (light emitting element). A resist is used to form the bank 947 in this embodiment. The bank 947 in this embodiment is about 1 μm in thickness, and a region of the bank 947 that covers the portion where the anode is in contact with the wiring line is tapered (FIG. 6A). The TFT substrate may be subjected to the operation testing again after it is brought into the processing room for forming a light emitting element.

Although a resist film is used for the bank 947 in this embodiment, a polyimide film, a polyamide film, an acrylic film, a BCB (benzocyclobutene) film, a silicon oxide film, or the like may be used in some cases. The bank 947 may be inorganic or organic as long as it is capable of insulating. If photosensitive acrylic is used to form the bank 947, it is preferable to etch a photosensitive acrylic film and then perform heat treatment at 180 to 350° C. When a non-photosensitive acrylic film is used, it is preferable to perform heat treatment at 180 to 350° C. first and then etch to form the bank.

Next, wiping treatment is performed on the surface of the anode. In this embodiment, the surface of the anode 944 is wiped using Bellclean (a product of Ozu Corporation) to level the surface of the anode 944 and remove dusts therefrom. In wiping, pure water is used as a washing liquid, the number of rotation of the axis around which Bellclean is wound is set to 100 to 300 rpm, and the depression value is set to 0.1 to 1.0 mm (FIG. 6A).

Next, the TFT substrate is baked in a vacuum. In order to release moisture and gas from the resin insulating film for forming the bank, the vacuum exhaust is conducted at a constant degree of vacuum, for example 0.01 Torr or less. The baking in a vacuum may be conducted after removing the anti-electrostatic film, after wiping treatment, or before feinting light emitting element.

A second insulating film 948 is formed to cover the bank 947 and the anode 944. The second insulating film 948 is an organic resin film, such as a polyimide film, a polyamide film, or a polyimideamide film, formed by spin coating, evaporation, sputtering, or the like to a thickness of 1 to 5 nm. By forming this insulating film, cracking in the surface of the anode 944 can be avoided and degradation of the light emitting element can be prevented.

An organic compound layer 949 and a cathode 950 are formed on the second insulating film 948 by evaporation. A MgAg electrode is used for the cathode of the light emitting element in this embodiment, but other known materials may be used instead. The organic compound layer 949 is a laminate that has, in addition to a light emitting layer, a hole injection layer, a hole transporting layer, an electron transporting layer, an electron injection layer, a buffer layer, etc. in combination. The structure of the organic compound layer used in this embodiment will be described in detail below.

In this embodiment, copper phthalocyanine is used for a hole injection layer whereas α-NPD is used for a hole transporting layer. Both of the layers are formed by evaporation.

A light emitting layer is formed next. In this embodiment, different materials are used for different light emitting layers to obtain organic compound layers that emit light of different colors. The organic compound layers formed in this embodiment are three types: ones that emit red light, ones that emit green light, and ones that emit blue light. All types of organic compound layers are formed by evaporation. Therefore, it is possible to use a metal mask to form light emitting layers from a material that varies between different pixels.

A light emitting layer that emits red light is formed from $Alq_3$ doped with DCM. Instead, N,N'-disalicylidene-1,6-hexanediaminate) zinc (II) (Zn(salhn)) doped with (1,10-phenanthroline)-tris(1,3-diphenyl-propane-1,3-dionato) europium (III) $(Eu(DBM)_3(Phen))$ that is an Eu complex may be used. Other known materials may also be used.

A light emitting layer that emits green light can be formed from CBP and $Ir(ppy)_3$ by coevaporation. It is preferable to form a hole blocking layer from BCP in this case. An aluminum quinolilate complex $(Alq_3)$ and a benzoquinolinolate beryllium complex (BeBq) may be used instead. The layer may be formed from a quinolilate aluminum complex $(Alq_3)$ using as dopant Coumarin 6, quinacridon, or the like. Other known materials may also be used.

A light emitting layer that emits blue light can be formed from DPVBi that is a distylyl derivative, N,N'-disaliyliden-1,6-hexanediaminate) zinc (II) (Zn(salhn)) that is a zinc complex having an azomethine compound as its ligand, or 4,4'-bis(2,2-diphenyl-vinyl)-biphenyl (DPVBi) doped with perylene. Other known materials may also be used.

An electron transporting layer is formed next. 1,3,4-oxadiazole derivatives, 1,2,4-triazole derivatives (e.g., TAZ), or the like can be used for the electron transporting layer. In this embodiment, a 1,2,4-triazole derivative (TAZ) is formed by evaporation to a thickness of 30 to 60 nm.

Through the above steps, the organic compound layer having a laminate structure is completed. In this embodiment, the organic compound layer 949 is 10 to 400 nm (typically 60 to 150 nm) in thickness, and the cathode 950 is 80 to 200 nm (typically 100 to 150 nm) in thickness.

After the organic compound layer is formed, the cathode 950 of the light emitting element is formed by evaporation. In this embodiment, MgAg is used for a conductive film that constitutes the cathode of the light emitting element. However, a Al—Li alloy film (an alloy film of aluminum and lithium) or a film obtained by co-evaporation of aluminum and an element belonging to Group 1 or 2 in the periodic table may also be used.

Figure 6B:
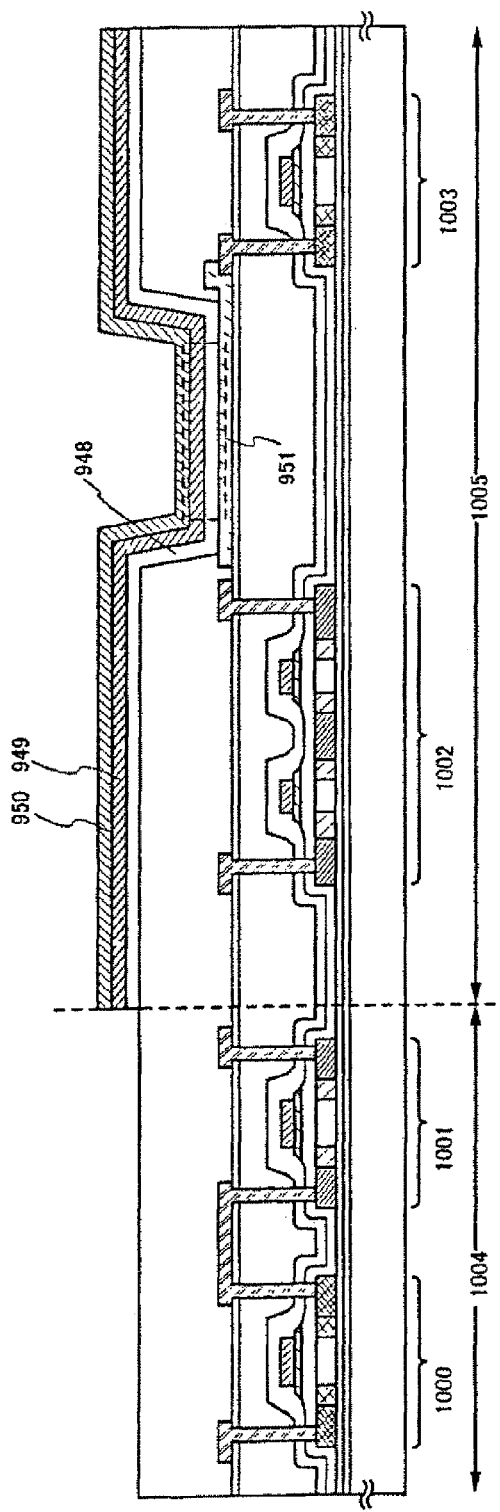

Thus completed is a light emitting device having the structure shown in FIG. 6B. A portion 951 where the anode 944, the organic compound layer 949, and the cathode 950 overlap corresponds to the light emitting element.

A p-channel TFT 1000 and an n-channel TFT 1001 are TFTs of the driving circuit, and constitute a CMOS. A switching TFT 1002 and a current controlling TFT 1003 are TFTs of the pixel portion. The TFTs of the driving circuit and the TFTs of the pixel portion can be formed on the same substrate.

In the case of a light emitting device using a light emitting element, its driving circuit can be operated by a power supply having a voltage of about 5 to 6V, 10 V, at most. Therefore degradation of TFTs due to hot electron is not a serious problem.

Embodiment 2

This embodiment describes another example of process of manufacturing a light emitting device with reference to FIGS. 19 to 22B.

Following the description in Embodiment 1, the steps up through the step of forming two layers of conductive films 907 and 908 on the gate insulating film 906 as shown in FIG. 3A are finished.

Subsequently, a process where the conductive films 907 and 908 are etched using masks 909a to 909d to form conductive layers 3901 to 3904 having a first taper shape is described in FIG. 20A. ICP (inductively coupled plasma) etching is used for this etching. Though etching gas is not limited, $CF_4$, $Cl_2$, and $O_2$ are used to etch a W film and a tantalum nitride film. The gas flow rate of $CF_4$, $Cl_2$, and $O_2$ is respectively set to 25/25/10, and RF (13.56 MHz) power of 500 W is given to a coiled electrode at a pressure of 1 Pa for the etching. RF (13.56 MHz) power of 150 W is also given to the substrate side (sample stage) so that substantially negative self-bias voltage can be applied. Under these first etching conditions, mainly the W film is etched to have a given shape.

Thereafter, the etching gas is changed to $CF_4$ and $Cl_2$, the ratio of gas flow rate thereof is set to 30/30, and RF (13.56 MHz) power of 500 W is given to a coiled electrode at a pressure of 1 Pa to generate plasma for 30 second etching. RF (13.56 MHz) power of 20 W is also given to the substrate side (sample stage) so that substantially negative self-bias voltage can be applied. With the mixture of $CF_4$ and $Cl_2$, the tantalum nitride film and the W film are etched at about the same rate. Thus formed are the conductive layers 3901 to 3904 having a first taper shape. The taper thereof has an angle of 45 to 75°. In order to etch the films without leaving any residue on the second insulating film, the etching time is prolonged by about 10 to 20% for over-etching. Surfaces of regions of the gate insulating film 906 that are not covered with the first taper shape conductive layers 3901 to 3904 are etched and thinned by about 20 to 50 nm (FIG. 20A).

Subsequently, second etching treatment is conducted as shown in FIG. 20B without removing the masks 909a to 909d. In the second etching treatment, $CF_4$, $CL_2$, and $O_2$ are mixed as etching gas, the ratio of gas flow rate thereof is set to 20/20/20, and an RF (13.56 MHz) power of 500 W is given to a coiled electrode at a pressure of 1 Pa to generate plasma. The substrate side (sample stage) receives an RF (13.56 MHz) power of 20 W to apply a self-bias voltage lower than that in the first etching treatment. Under these etching conditions, the W film that is the second conductive film is etched. Thus formed are conductive layers 3905 to 3908 having a second taper shape. Surfaces of regions of the gate insulating film 906 that are not covered with the second taper shape conductive layers 3905 to 3908 are etched and thinned by about 20 to 50 nm.

After removing the resist masks, first doping treatment is conducted to dope the semiconductor layers with an impurity element that gives the n type conductivity (n type impurity element). The first doping treatment uses ion doping for injecting ions without mass separation. In the doping, the second taper shape conductive layers 3905 to 3908 are used as masks and phosphine ($PH_3$) gas diluted by hydrogen or phosphine gas diluted by rare gas is used to form n type impurity regions 3909 to 3912 that contain an n type impurity element in a first concentration in the semiconductor layers 902 to 905. The n type impurity regions 3909 to 3912 formed through this doping, which contain an n type impurity element in a first concentration, contain phosphorus in a concentration of $1\times10^{16}$ to $1\times10^{17}$ atoms/cm$^3$ (FIG. 20C).

Formed next are first masks 3913 and 3915 that completely cover the semiconductor layers 902 and 905, respectively, and a second mask 3914 that covers the second taper shape conductive layer 3907 on the semiconductor layer 904 and covers a part of the semiconductor layer 904. Then, second doping treatment is conducted. In the second doping treatment, the semiconductor layer 903 is doped through the second taper shape conductive layer 3906a to have an n type impurity region 3917 that contains an n type impurity element in a second concentration and n type impurity regions 3916 and 3918 that contain an n type impurity element in a third concentration each. The n type impurity region 3917 formed through this doping, which contains an n type impurity element in a second concentration, contain phosphorus in a concentration of $1\times10^{17}$ to $1\times10^{19}$ atoms/cm$^3$. The n type impurity regions 3916 and 3918 formed through this doping, which contain an n type impurity element in a third concentration each, contain phosphorus in a concentration of $1\times10^{20}$ to $1\times10^{21}$ atoms/cm$^3$ (FIG. 20D).

As described above, the n type impurity region that contains an n type impurity element in a second concentration and the n type impurity regions that contain an n type impurity element in a third concentration each are formed in one doping step in this embodiment. However, the doping step may be divided into two steps to dope the semiconductor layer with the impurity element.

Figure 21A:
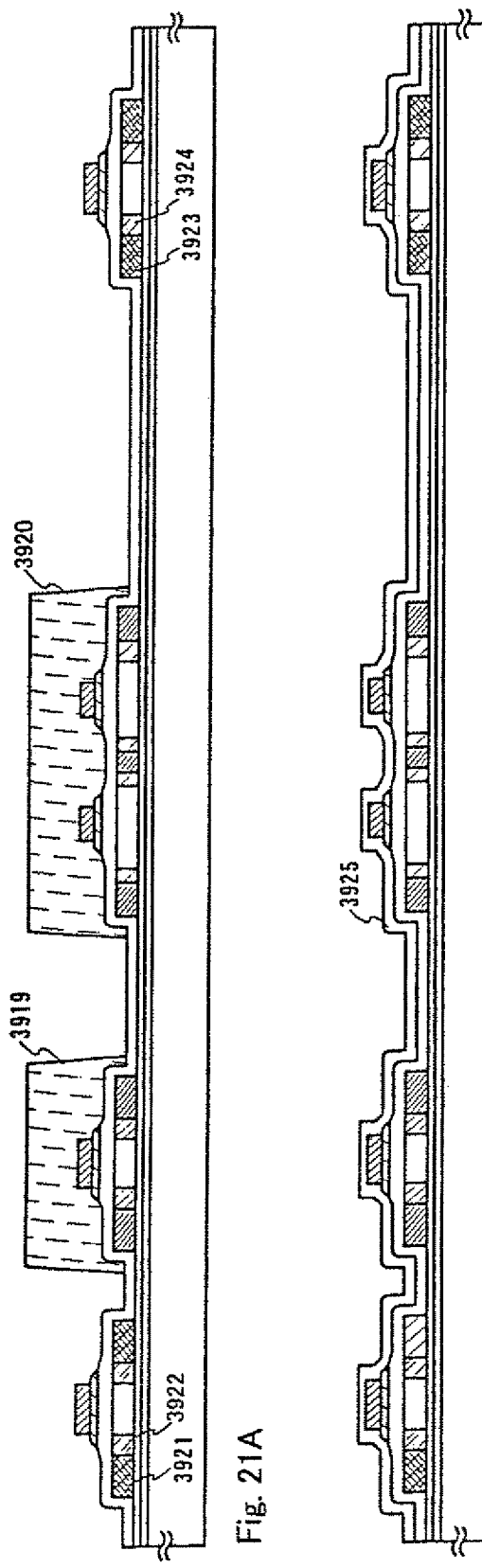
FIGS. 21A to 21C are diagrams showing an example of carrying out a light emitting device manufacture process.

Next, masks 3919 and 3920 for covering the semiconductor layers 903 and 904 are formed as shown in FIG. 21A to conduct third doping treatment. In the doping, diborane ($B_2H_6$) gas diluted by hydrogen or diborane gas diluted by rare gas is used to form, in the semiconductor layers 902 and 905, p type impurity regions 3921 and 3923 that contain a p type impurity element in a first concentration and p type impurity regions 3922 and 3924 that contain a p type impurity element in a second concentration. The p type impurity regions 3921 and 3923, which contain a p type impurity element in a first concentration, contain boron in a concentration of $2\times10^{20}$ to $3\times10^{21}$ atoms/cm$^3$ each. The p type impurity regions 3922 and 3924, which contain a p type impurity element in a second concentration, contain boron in a concentration of $1\times10^{18}$ to $1\times10^{20}$ atoms/cm$^3$ each. The p type impurity regions 3922 and 3924 that contain a p type impurity element in a second concentration are formed in regions that overlap the second taper shape conductive layers 3905a and 3908a.

Figure 21B:
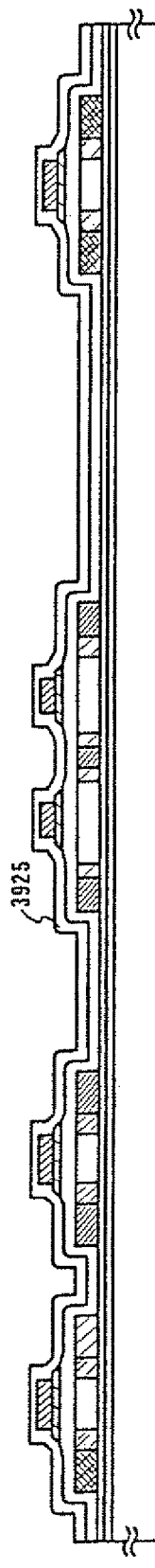

As shown in FIG. 21B, a first interlayer insulating film 3925 is formed from a silicon nitride film or a silicon oxynitride film formed by plasma CVD to have a thickness of 50 nm. In order to give activation treatment to the impurity elements that are used to dope the semiconductor layers, heat treatment is conducted at 410° C. using a furnace. This heat treatment also hydrogenates the semiconductor layers by hydrogen released from the silicon nitride film or silicon oxynitride film.

The heat treatment may be achieved by other methods than the method that uses a furnace. A heat treatment method by RTA may be used instead (including an RTA method using gas or light as the heat source). If the heat treatment is carried out using a furnace, an insulating film for covering the gate electrode and the gate insulating film is formed prior to heat treatment, or the heat treatment atmosphere is set to a reduced pressure nitrogen atmosphere, in order to prevent oxidization of the conductive film that forms the gate electrode. Alternatively, the semiconductor layers may be irradiated with second harmonic (532 nm) light of a YAG laser. As can be seen in the above, there are several ways to activate the impurity elements used to dope the semiconductor layers, and an operator can choose from them one that suits him.

Figure 21C:
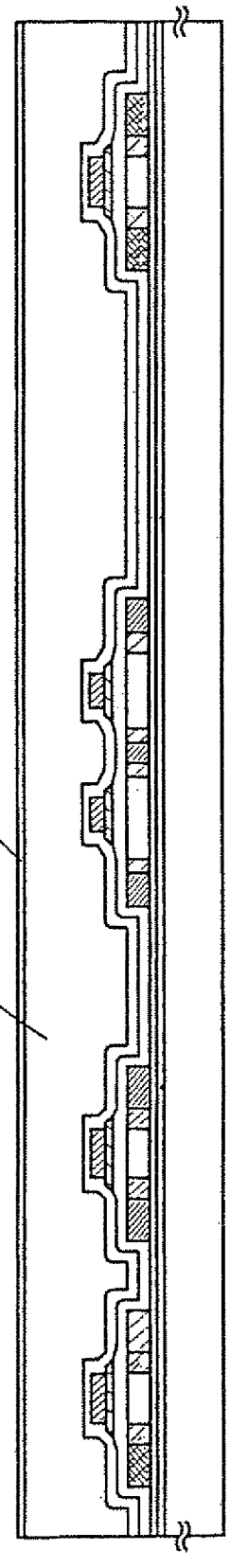

On the first interlayer insulating film 3925, a second interlayer insulating film 3926 is formed from acrylic. A silicon nitride film is formed on the second interlayer insulating film 3926 by sputtering as a first insulating film 3927 for protecting the TFTs from impurities (hereinafter the film is also called a barrier insulating film) (FIG. 21C).

On the barrier insulating film 3927, a transparent conductive film is formed to have a thickness of 80 to 120 nm and is etched to form an anode 3928 (FIG. 22A). The transparent electrode in this embodiment is an indium tin oxide (ITO) film, or a transparent conductive film obtained by mixing indium oxide with 2 to 20% of zinc oxide (ZnO).

A resist mask having a given pattern is then formed to form contact holes reaching respectively the impurity regions 3916, 3918, 3921, and 3923 that are formed in the semiconductor layers to serve as source regions or drain regions. The contact holes are formed by dry etching.

A metal conductive film is formed by sputtering or vacuum evaporation and patterned using a mask. The film is then etched to form wiring lines 3929 to 3935. Though not shown in the drawings, the wiring lines in this embodiment are formed from a laminate of a Ti film with a thickness of 50 nm and an alloy film (Al—Ti alloy film) with a thickness of 500 nm.

Next, a third interlayer insulating film 3936 is formed to cover the anode 3928 and the wiring lines 3929 to 3935. Now, the manufacture process proceeds to a step where the substrate is moved from a processing room for forming a TFT substrate (hereinafter referred to as first clean room) to a processing room for forming a light emitting element (hereinafter referred to as second clean room) in order to reduce the risk of mixing the alkaline metal from the alkaline metal material, such as Al or Mg, used for the cathode of the light emitting element into the active layers of the TFTs.

To avoid contamination of the TFT substrate by dusts in the air and electrostatic discharge damage of the TFT substrate by static electricity during the moving, a very thin film 3937 having an anti-electrostatic effect (hereinafter referred to as anti-electrostatic film) is formed on the third interlayer insulating film 3936. The anti-electrostatic film 3937 is formed from a material that can be removed by water washing or like other simple methods (FIG. 22A). Instead of forming an anti-electrostatic film, the substrate may be stored in a case capable of preventing electrostatic discharge damage during moving. Before changing processing rooms, the TFT substrate that has finished the steps above may be subjected to operation testing. The steps up through this point are for processing in the first processing room (clean room) which is shown in the flow chart of FIG. 19.

Various cases are conceivable in moving the TFT substrate from the first processing room to the second processing room. For example, the TFT substrate may be moved between different buildings on the same premise, or between factories (processing rooms, e.g., clean rooms) located in different sites but owned by the same incorporation, or between factories (processing rooms, e.g., clean rooms) owned by different incorporations. In any case, moving is carried out while taking a care not to damage the TFT substrate.

Figure 19:
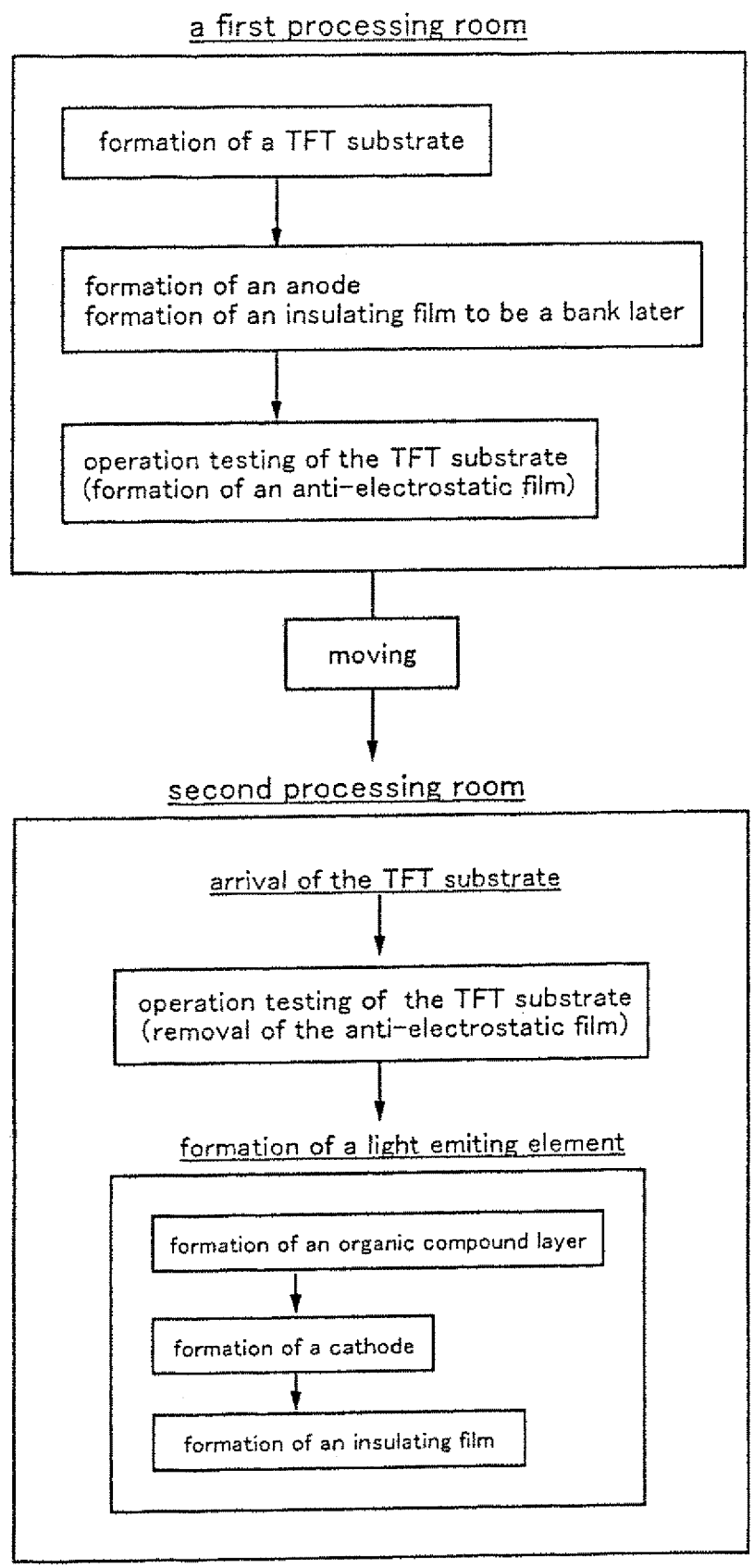
FIG. 19 is a conceptual diagram showing a production process of the present invention.

Then, the manufacture process proceeds to processing in the second processing room (clean room) which is shown in a flow chart of FIG. 19. The TFT substrate brought into the second processing room (clean room) is washed with water to remove the anti-electrostatic film 3937. Third interlayer insulating film 3936 is etched to form a bank 3938. The bank has an opening at a position that coincides with the pixel (light emitting element), and is tapered to cover a portion where the wiring line 3934 is in contact with the anode 3928 and to cover the edges of the anode 3928. In this embodiment, the bank 3938 is formed from a resist to have a thickness of about 1 µm. At this point, the operation testing may be performed again on the TFT substrate brought into the second processing room.

In order to prevent degradation of the light emitting element due to moisture and gas released from the bank 3938, the surface of the bank 3938 is covered with a second insulating film 3939 that is a silicon nitride film or the like. The second insulating film 3939 is an insulating film for protecting the light emitting element from moisture and gas, which cause degradation of the light emitting element. Accordingly, the second insulating film 3939 is also called a second barrier insulating film 3939.

Next, the TFT substrate is baked in a vacuum. In order to release moisture and gas from the resin insulating film for forming the bank, the vacuum exhaust is conducted at a constant degree of vacuum, for example 0.01 Torr or less. The baking in a vacuum may be conducted after removing the anti-electrostatic film, or before forming light emitting element.

Next, an organic compound layer 3940 is formed by evaporation on the second insulating film 3939 such that the organic compound layer comes into contact with the anode 3928. On the organic compound layer 3940, a cathode 3941 is formed by evaporation. This embodiment uses a MgAg electrode for the cathode of the light emitting element, but other known materials may be used instead. The organic compound layer 3940 is a laminate that has, in addition to a light emitting layer, a hole injection layer, a hole transporting layer, an electron transporting layer, an electron injection layer, a buffer layer, etc. in combination. The organic compound layer in this embodiment is formed by following the description of Embodiment 1.

Thus completed is a light emitting device having the structure shown in FIG. 22B. A portion 3942 where the anode 3928, the organic compound layer 3940, and the cathode 3941 overlap corresponds to the light emitting element.

As described above, by separating a processing room for forming a TFT substrate (e.g., a first clean room) from a processing room for forming a light emitting element (e.g., a second clean room), an active layer of a TFT can be protected from an alkaline metal material such as Al or Mg used for a cathode of a light emitting element and an excellent light emitting device is obtained.

Embodiment 3

Following the description of Embodiment 1 or 2, the manufacture process up through the step of forming the second interlayer insulating film (935 or 3926) is finished. Then, instead of forming the first insulating film 936 of Embodiment 1, plasma treatment is performed on the second interlayer insulating film to modify the surface of the second interlayer insulating film (935 or 3926). This method will be described with reference to FIG. 7.

Figure 7:
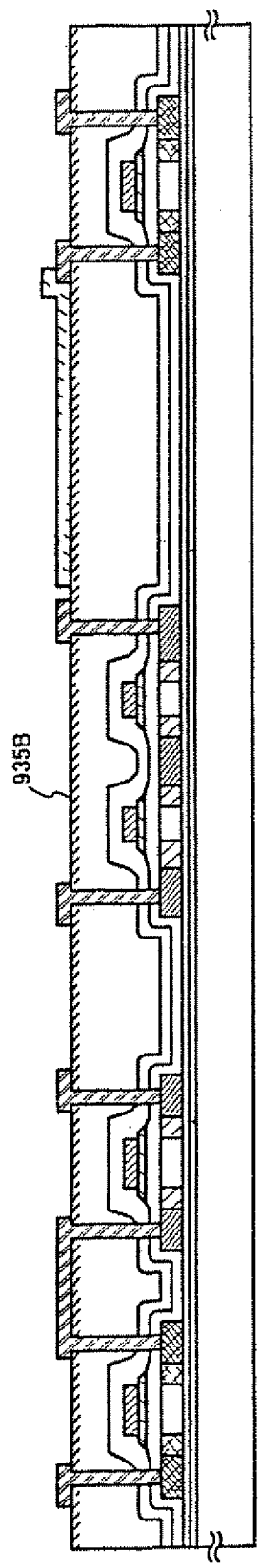
FIG. 7 is a diagram showing an example of carrying out a light emitting device manufacture process.

The second interlayer insulating film (935 or 3926) receives plasma treatment in, for example, one or more kinds of gas selected from the group consisting of hydrogen, nitrogen, hydrocarbon, halogenated carbon, hydrogen fluoride, and rare gas (such as Ar, He, or Ne), so that a coat is newly formed on the surface of the second interlayer insulating film (935 or 3926) or the existing functional group on the surface is changed to a different functional group. The surface modification of the second interlayer insulating film (935 or 3926) is, thus achieved. As shown in FIG. 7, a dense film 935B is formed on the surface of the second interlayer insulating film (935 or 3926). This film is called a cured film 935B in this specification. The film prevents release of gas or moisture from the organic resin film.

In this embodiment, an anode (ITO) is formed after the surface modification, thereby avoiding a situation in which materials having different thermal expansion coefficients receive heat treatment while being in direct contact with each other. Therefore, cracking in the ITO electrode is prevented and degradation of the light emitting element can be prevented. The plasma treatment for the second interlayer insulating film (935 or 3926) may be given before or after forming contact holes.

The cured film 935B is formed by performing plasma treatment on the surface of the second interlayer insulating film (935 or 3926) that is formed of an organic in insulating material in one or more kinds of gas selected from the group consisting of hydrogen, nitrogen, hydrocarbon, halogenated carbon, hydrogen fluoride, and rare gas (such as Ar, He, or Ne). Accordingly, the cured film 935B contains one of the gas elements out of hydrogen, nitrogen, hydrocarbon, halogenated carbon, hydrogen fluoride, and rare gas (such as Ar, He, or Ne).

Embodiment 4

Figure 12:
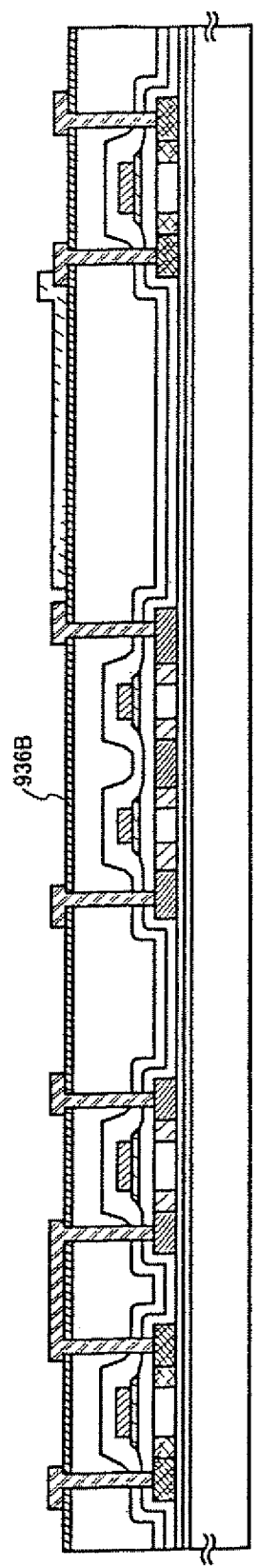
FIG. 12 is a diagram showing an example of carrying out a light emitting device manufacture process.

Following the description of Embodiment 1 or 2, the manufacture process up through the step of forming the second interlayer insulating film (935 or 3926) is finished. Then, as shown in FIG. 12, a DLC film 936B as the first insulating film 936 is formed on the second interlayer insulating film (935 or 3926).

A characteristic of the DLC film is having a Raman spectrum distribution that has an asymmetric peak around 1550 $cm^{-1}$ and a shoulder around 1300 $cm^{-1}$. When measured by a microhardness tester, the DLC film exhibits a hardness of 15 to 25 GPa. The DLC film is also characterized by its excellent resistance to chemicals. Moreover, the DLC film can be formed at a temperature range between room temperature and 100° C. Examples of the method that can be used to form the DLC film include sputtering, ECR plasma CVD, high frequency plasma CVD, and ion beam evaporation. The thickness of the DLC film is set to 5 to 50 nm.

Embodiment 5

This embodiment describes a case of employing other insulating films than a DLC film to form as the insulating film 936 on the second interlayer insulating film (935, 3926).

Following the description of Embodiment 1 or 2, the manufacture process up through the step of forming the second interlayer insulating film (935 or 3926) is finished. Then, as the first insulating film 936, a silicon nitride film 936 is formed by sputtering using silicon as a target. The film formation conditions can be set suitably, but it is particularly preferable to use nitrogen ($N_2$) or mixture of nitrogen and argon as sputtering gas and apply a high frequency power for sputtering. The substrate temperature is set to room temperature and it is not always necessary to use heating means. If an organic insulating film is used as the interlayer insulating film, it is preferred to form the silicon nitride film without heating the substrate. In order to remove the adsorbed or occluded moisture well, dehydrogenating treatment is preferably conducted by heating the substrate in vacuum at 50 to 100° C. for several minutes to several hours. To give an example of the film formation conditions, a 1 to 2Ω sq. silicon target doped with boron is used, nitrogen gas alone is supplied, a high frequency power (13.56 MHz) of 800 W is given at 0.4 Pa, and the size of the target is set to 152.4 mm in diameter. The film formation rate obtained under these conditions is 2 to 4 nm/min.

The thus obtained silicon nitride film contains impurity elements such as oxygen and hydrogen in a concentration of 1 atomic % or less, and has 80% or higher transmissivity in the visible light range. The transparency of this film is proved to be high especially by the fact that the film has a transmissivity of 80% or above at a wavelength of 400 nm. Furthermore, this method is capable of forming a dense film without seriously damaging the surface.

As described above, a silicon nitride film can be used for the insulating film 936. The subsequent steps are identical with those in Embodiment 1 or 2.

Embodiment 6

This embodiment describes a case of employing other insulating films than a DLC film to form as the first insulating film 936 on the second interlayer insulating film (935, 3926).

Following the description of Embodiment 1 or 2, the manufacture process up through the step of forming the second interlayer insulating film (935 or 3926) is finished. Then, an $Al_XN_Y$ film is formed using an aluminum nitride (AlN) target under an atmosphere obtained by mixing argon gas and nitrogen gas. The acceptable range for the concentration of impurities, oxygen, in particular, contained in the $Al_XN_Y$ film is less than 0 to 10 atomic %. The oxygen concentration can be controlled by adjusting sputtering conditions (the substrate temperature, the type of raw material gas used, the flow rate thereof, the film formation pressure, etc.) appropriately. Alternatively, the film may be formed using an aluminum (Al) target under an atmosphere containing nitrogen gas. The film may be formed by evaporation or other known techniques instead of sputtering.

Other than the $Al_XN_Y$ film, it is possible to use a $AlN_XO_Y$ film that is formed using an aluminum nitride (AlN) target under an atmosphere obtained by mixing argon gas, nitrogen gas, and oxygen gas. The acceptable range for concentration of nitrogen contained in the $AlN_XO_Y$ film is a few atomic % or more, preferably 2.5 to 47.5 atomic %. The nitrogen concentration can be controlled by adjusting sputtering conditions (the substrate temperature, the type of raw material gas used, the flow rate thereof, the film formation pressure, etc.) appropriately. Alternatively, the film may be formed using an aluminum (Al) target under an atmosphere containing nitrogen gas and oxygen gas. The film may be formed by evaporation or other known techniques instead of sputtering.

The above $Al_XN_Y$ film and $AlN_XO_Y$ film are both highly light-transmissive (having a transmissivity of 80 to 91.3% in the visible light range) and do not block light emitted from the light emitting element.

As described in the above, a $Al_XN_Y$ film or $AlN_XO_Y$ film can be used for the insulating film 936. The subsequent steps are identical with those in Embodiment 1.

Embodiment 7

Figure 13:
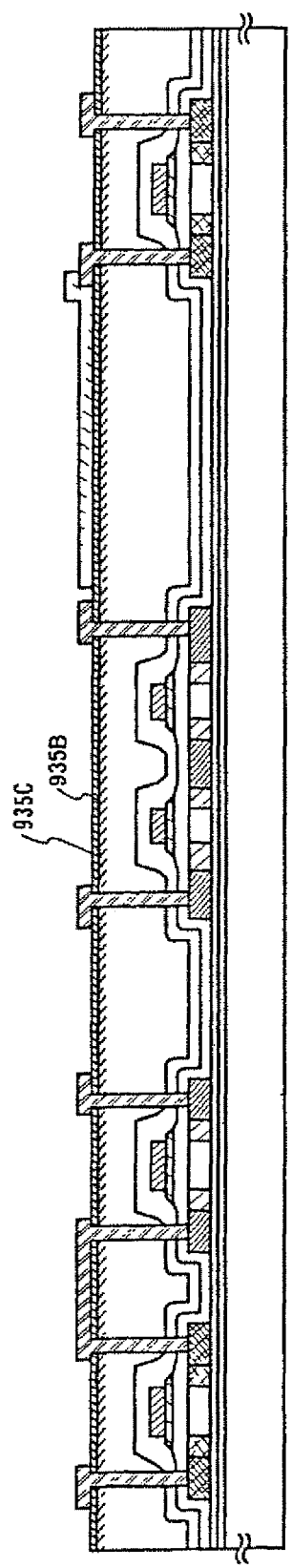
FIG. 13 is a diagram showing an example of carrying out a light emitting device manufacture process.

Following the description of Embodiment 1 or 2, the manufacture process up through the step of forming the second interlayer insulating film (935 or 3926) is finished. Then, as shown in FIG. 13, the surface of the second interlayer insulating film is modified by plasma treatment to form a cured film 935B on the surface. A DLC film 936B is formed on the cured film 935B. Sputtering, ECR plasma CVD, high frequency plasma CVD, ion beam evaporation, etc. can be used to form the DLC film 936B to have a thickness of 5 to 50 nm.

Embodiment 8

The bank (947 or 3938) is fanned in accordance with the manufacture process in Embodiment 1 or 2. Then, plasma treatment is performed on the surface of the bank (947 or 3938) to modify the surface of the bank (947 or 3938). This case will be described with reference to FIG. 8.

An organic resin insulating film is used to form the bank (947 or 3938). Undesirably, the organic resin insulating film is easy to release moisture or gas due to heat to generated while the light emitting device is in operation.

Figure 8:
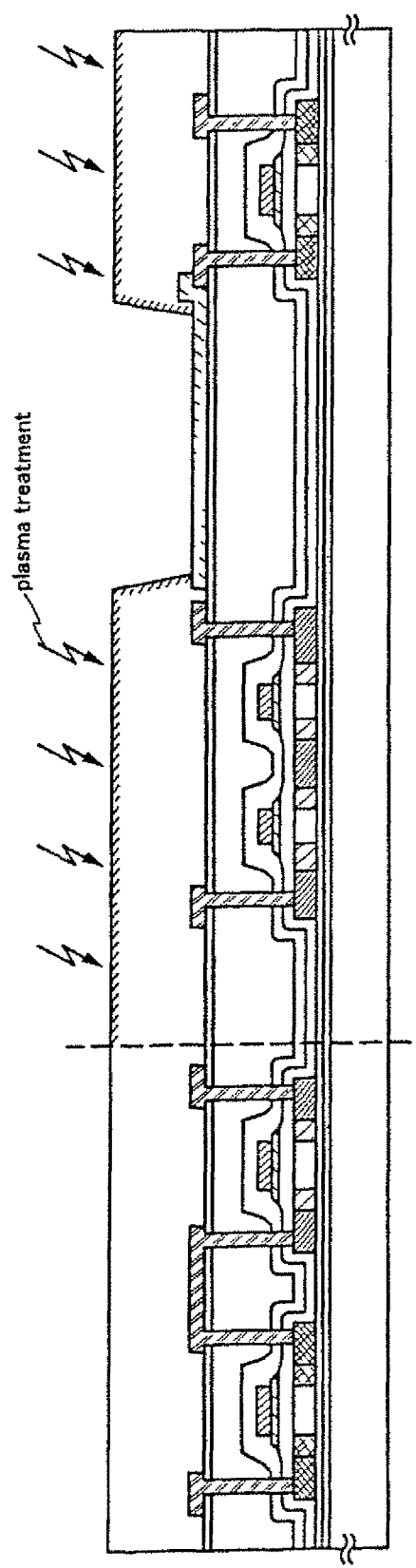
FIG. 8 is a diagram showing an example of carrying out a light emitting device manufacture process.

Accordingly, after the heat treatment, plasma treatment is conducted for surface modification of the bank as shown in FIG. 8. The plasma treatment is carried out in one or more kinds of gas selected from the group consisting of hydrogen, nitrogen, halogenated carbon, hydrogen fluoride, and rare gas.

As a result, the surface of the bank becomes dense to form a cured film that contains one or more kinds of gas elements selected from the group consisting of hydrogen, nitrogen, halogenated carbon, hydrogen fluoride, and rare gas. The cured film can prevent release of moisture and gas (oxygen) from the inside, thereby preventing degradation of the light emitting element.

This embodiment may be combined with any of Embodiments 1 through 7.

Embodiment 9

Following the description of Embodiment 1, the manufacture process up through the step of forming the second interlayer insulating film (935 or 3926) is finished (FIG. 18A). Then, a first insulating film 936 is formed on the second interlayer insulating film (935 or 3926). The first insulating film 936 may be the DLC film, silicon nitride film, aluminum nitride film, or aluminum nitride oxide film described in Embodiment 2 or 3. On the first insulating film 936, an ITO film is formed and patterned into a desired shape to form an anode 1937.

A resist mask having a given pattern is then formed to form contact holes reaching the impurity regions that are formed in the semiconductor layers to serve as source regions or drain regions. The contact holes are formed by dry etching or the like. This is done in accordance with Embodiment 1.

A metal conductive film is formed by sputtering or vacuum evaporation and etched to form wiring lines 1938 to 1944. Similar to Embodiment 1, the wiring lines 1938 to 1944 are formed from a laminate of a Ti film with a thickness of 50 nm and an alloy film (Al—Ti alloy film) with a thickness of 500 nm.

In the case where the anode 1937 is fowled before forming the wiring lines 1938 to 1944 as in this embodiment (FIG. 18B), a problem such as breaking of wire is not caused even when the anode is formed from a material of poor coverage because the to broken wiring line 1943 is situated on the anode 1938.

After the wiring lines are formed, a bank, an organic compound layer, and a cathode are formed in accordance with Embodiment 1.

This embodiment may be combined with Embodiments 1 through 7.

Embodiment 10

This embodiment describes a method in which a semiconductor film to serve as an active layer of a TFT is crystallized using a catalytic element and then the concentration of the catalytic element in the obtained crystalline semiconductor film is reduced.

Figure 17A:
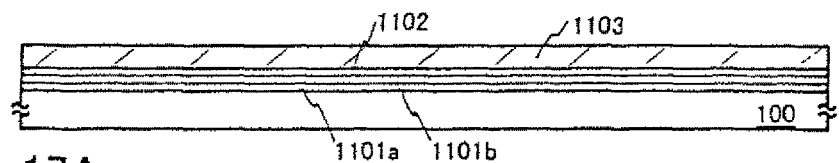
FIGS. 17A to 17F are diagrams showing a process of manufacturing a light emitting device in accordance with an embodiment.

In FIG. 17A, a substrate 1100 is preferably formed from barium borosilicate glass, alumino borosilicate glass, or quartz. On the surface of the substrate 1100, an inorganic insulating film with a thickness of 10 to 200 nm is formed as a base insulating film 1101. An example of a suitable base insulating film is a silicon oxynitride film formed by plasma CVD. A first silicon oxynitride film is formed to have a thickness of 50 nm from $SiN_4$, $NH_3$, and $N_2O$, and a second silicon oxynitride film is formed next to have a thickness of 100 nm from $SiH_4$ and $N_2O$ to obtain the base insulating film. The base insulating film 1101 is provided to prevent an alkaline metal contained in the glass substrate from diffusing into the semiconductor film to be formed in the upper layer, and therefore may be omitted if a quartz substrate is used.

A silicon nitride film 1102 is formed on the base insulating film 1101. The silicon nitride film 1102 is provided to prevent the catalytic element (typically, nickel) to be used later in a step of crystallizing the semiconductor film from clinging to the base insulating film 1101, and to avoid the adverse effect of oxygen contained in the base insulating film 1101. Note that the silicon nitride film 1102 is formed by plasma CVD to have a thickness of 1 to 5 nm.

An amorphous semiconductor film 1103 is formed on the silicon nitride film 1102. A semiconductor material mainly containing silicon is used for the amorphous semiconductor film 1103. The amorphous semiconductor film is typically an amorphous silicon film or an amorphous silicon germanium film formed by plasma CVD, reduced pressure CVD, or sputtering to have a thickness of 10 to 100 nm. In order to obtain satisfactory crystals, the concentration of impurities such as oxygen and nitrogen contained in the amorphous semiconductor film 1103 is reduced to $5\times10^{18}$ atoms/$cm^3$ or lower. These impurities can hinder crystallization of the amorphous semiconductor film and, after crystallization, increase the density of trap center and recombination center. For that reason, it is desirable to use a highly pure material gas and a ultra high vacuum CVD apparatus equipped with a mirror finish reaction chamber (processed by field polishing) and with an oil-free vacuum exhaust system. The base insulating film 1101, the silicon nitride film 1102, and the amorphous semiconductor film 1103 are continuously formed without exposing the substrate to the air.

Figure 17B:
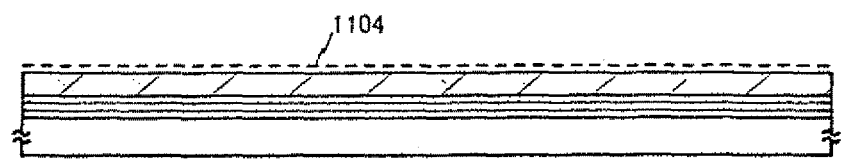

The surface of the amorphous silicon film 1103 is doped with a metal element having a catalytic function that accelerates crystallization (FIG. 17B). Examples of the metal element having a catalytic function that accelerates crystallization of a semiconductor film include iron (Fe), nickel (Ne), cobalt (Co), ruthenium (Ru), rhodium (Rh), palladium (Pd), osmium (Os), iridium (Ir), platinum (Pt), copper (Cu), and gold (Au). One or more kinds of metal elements selected from the above can be used. Typically, nickel is chosen and a nickel acetate solution containing 1 to 100 ppm of nickel by weight is applied by a spinner to form a catalyst-containing layer 1104. To make sure the solution is applied smoothly, surface treatment is performed on the amorphous silicon film 1103. The surface treatment includes forming a very thin oxide film from an ozone-containing aqueous solution, etching the oxide film with a mixture of fluoric acid and a hydrogen peroxide aqueous solution to form a clean surface, and again forming a very thin oxide film from the ozone-containing solution. Since a surface of a semiconductor film such as a silicon film is inherently hydrophobic, the nickel acetate solution can be applied evenly by forming an oxide film in this way.

The method of forming the catalyst-containing layer 1104 is not limited thereto, of course, and sputtering, evaporation, plasma treatment, or the like may be used instead.

While keeping the amorphous silicon film 1103 in contact with the catalyst-containing later 1104, heat treatment for crystallization is carried out. Furnace annealing using an electric furnace, or rapid thermal annealing (RTA) using a halogen lamp, a metal halide lamp, a xenon arc lamp, a carbon arc lamp, a high pressure sodium lamp, a high pressure mercury lamp, etc. is employed for the heat treatment.

If RTA is chosen, a lamp light source for heating is lit for 1 to 60 seconds, preferably 30 to 60 seconds, which is repeated 1 to 10 times, preferably 2 to 6 times. The intensity of light emitted from the lamp light source can be set arbitrarily, as long as the semiconductor film is heated to reach 600 to 1000° C., preferably 650 to 750° C., in an instant. When the temperature thereof reaches this high, the semiconductor film alone is instantaneously heated but the substrate 1100 is not deformed in itself. The amorphous semiconductor film is thus crystallized to obtain a crystalline silicon film 1105 shown in FIG. 17C. Crystallization by such treatment is achieved only when the catalyst-containing layer is provided.

Figure 17C:
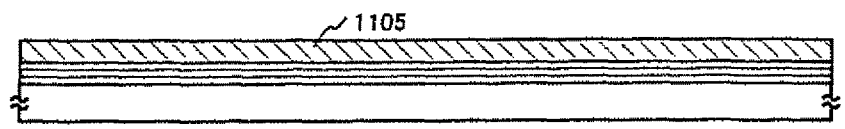

If furnace annealing is chosen instead, heat treatment at 500° C. is conducted for an hour to release hydrogen contained in the amorphous silicon film 1103 prior to the heat treatment for crystallization. Then, the substrate receives heat treatment in an electric furnace in a nitrogen atmosphere at 550 to 600° C., preferably at 580° C., for four hours to crystallize the amorphous silicon film 1103. The crystalline silicon film 1105 shown in FIG. 17C is thus formed.

It is effective to irradiate the crystalline silicon film 1105 with laser light in as order to raise the crystallization ratio (the ratio of crystal components to the entire volume of the film) and repair defects remaining in crystal grains.

The thus obtained crystalline silicon film 1105 has a remaining catalytic element (nickel, here) in a concentration higher than $1\times10^{19}$ atoms/$cm^3$ in average. The remaining catalytic element can affect TFT characteristics, and therefore the concentration of the catalytic element in the semiconductor film has to be reduced. How to reduce the concentration of the catalytic element in the semiconductor film subsequent to the crystallization step is described.

Figure 17D:
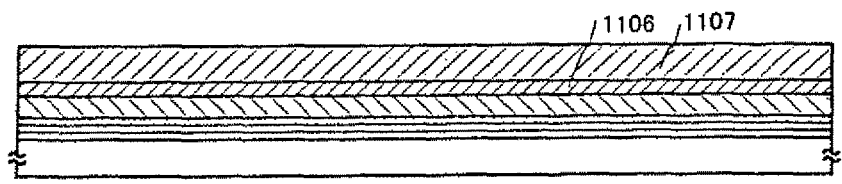

First, a thin layer 1106 is formed on the surface of the crystalline silicon film 1105 as shown in FIG. 17D. In this specification, the thin layer 1106 formed on the crystalline silicon layer 1105 is called a barrier layer 1106, for the layer is provided to prevent the crystalline silicon film 1105 from being etched when a gettering site is removed later.

The thickness of the barrier layer 1106 is set to 1 to 10 nm. A simple way to obtain the barrier layer is to form a chemical oxide by treating the surface with ozone water. A chemical oxide can be formed also when treating with an aqueous solution in which hydrogen peroxide water is mixed with sulfuric acid, hydrochloric acid, or nitric acid. Other usable methods include plasma treatment in an oxidization atmosphere, and oxidization treatment by ozone generated through UV irradiation in an atmosphere containing oxygen. Alternatively, a thin oxide film formed by heating in a dean oven until it reaches 200 to 350° C. may be used as the barrier layer. An oxide film formed by plasma CVD, sputtering, or evaporation to have a thickness of 1 to 5 nm may also be used as the barrier layer. In any case, the film used as the barrier layer has to allow the catalytic element to move into a gettering site in the gettering step, while being capable of preventing etchant from seeping into the crystalline silicon film 1105 (protecting the film 1105 against the etchant) in the step of removing the gettering site. Examples of such film include a chemical oxide film fainted through ozone water treatment, a silicon oxide ($SiO_X$) film, and a porous film.

On the barrier layer 1106, a second semiconductor film (typically, an amorphous silicon film) is formed as a gettering site 1107 to have a thickness of 20 to 250 nm. The second semiconductor film contains a rare gas element in a concentration of $1\times10^{20}$ atoms/cm$^3$ or higher. The gettering site 1107, which is to be removed later, is preferably a low density film in order to increase the selective ratio to the crystalline silicon film 1105 in etching.

A rare gas element itself is inert in a semiconductor film. Therefore the rare gas element does not affect the crystalline silicon film 1105. One or more kinds of elements selected from the group consisting of helium (He), neon (Ne), argon (Ar), krypton (Kr), and xenon (Xe) are used as the rare gas element. The present invention is characterized in that the rare gas elements are used as ion sources to form a gettering site and that a semiconductor film containing these elements are formed to serve as the gettering site.

To make sure the gettering is conducted thoroughly, heat treatment is needed at this point. The heat treatment is achieved by furnace annealing or RTA. If furnace annealing is chosen, heat treatment is conducted in a nitrogen atmosphere at 450 to 600° C. for 0.5 to 12 hours. If RTA is chosen, a lamp light source for heating is lit for 1 to 60 seconds, preferably 30 to 60 seconds, which is repeated 1 to 10 times, preferably 2 to 6 times. The intensity of light emitted from the lamp light source can be set arbitrarily, as long as the semiconductor film is heated to reach 600 to 1000° C., preferably 700 to 750° C., in an instant.

Figure 17E:
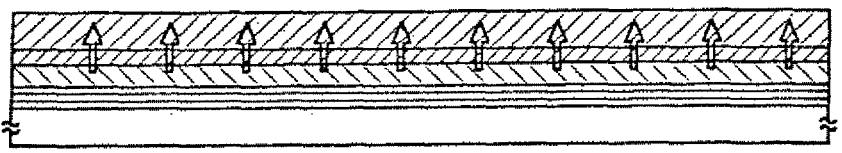

During gettering, the catalytic element in a to-be-gettered region (trap site) is released by thermal energy and is moved to the gettering site through diffusion. Accordingly, gettering is dependent on the process temperature and gettering progresses in a shorter period of time at a higher temperature. In the present invention, the distance the catalytic element moves during gettering is about the same as the thickness of the semiconductor film, and therefore gettering in the present invention is completed in a relatively short period of time (FIG. 17E).

This heat treatment does not crystallize the semiconductor film 1107 that contains a rare gas element in a concentration of $1\times10^{19}$ to $1\times10^{21}$ atoms/cm$^3$, preferably $1\times10^{20}$ to $1\times10^{21}$ atoms/cm$^3$, more desirably $5\times10^{20}$ atoms/cm$^3$. This is supposedly because the rare gas element is not re-discharged in the above range of the process temperature and the remaining elements hinder crystallization of the semiconductor film.

After the gettering step is ended, the gettering site 1107 is removed by selective etching. The etching method employed may be dry etching by $ClF_3$ without using plasma, or wet etching using hydrazine or an alkaline solution such as an aqueous solution that contains tetraethyl ammonium hydroxide (chemical formula: $(CH_3)_4NOH$). The barrier layer 1106 functions as an etching stopper at this point. Thereafter, the barrier layer 1106 is removed using fluoric acid.

Figure 17F:
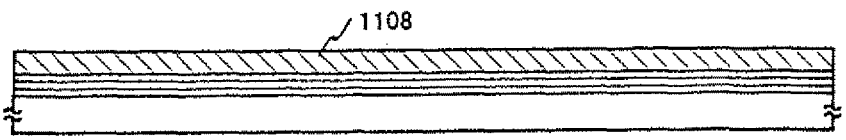

In this way, a crystalline silicon film 1108 in which the concentration of the catalytic element is reduced to $1\times10^{17}$ atoms/cm$^3$ or less is obtained as shown in FIG. 17F. The thus formed crystalline silicon film 1108 is a mass of thin rod-like crystals, or thin flattened rod-like crystals due to the effect of the catalytic element. Macroscopically, each of the crystals grows with a specific orientation.

This embodiment may be combined with Embodiments 1 through 9.

Embodiment 11

Figure 9A:
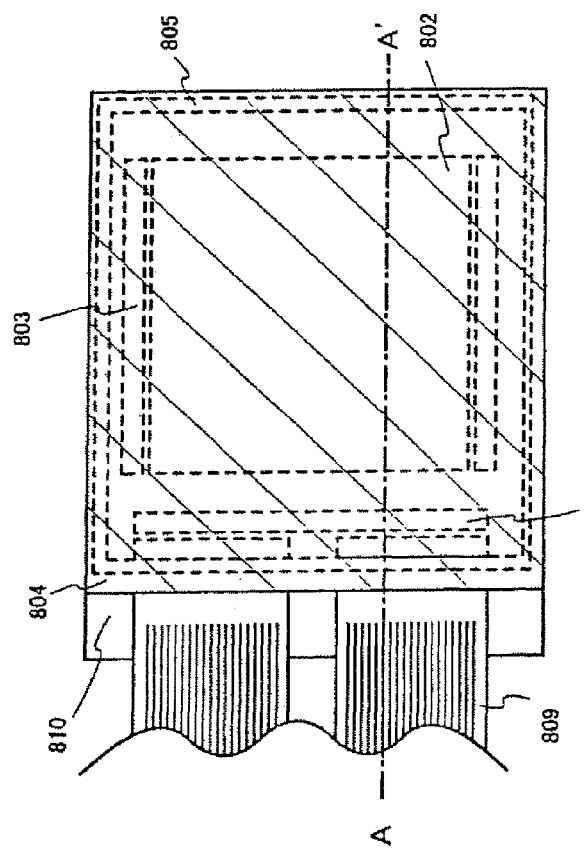
FIGS. 9A and 9B are diagrams showing a sealing structure for a light emitting device.
Figure 9B:
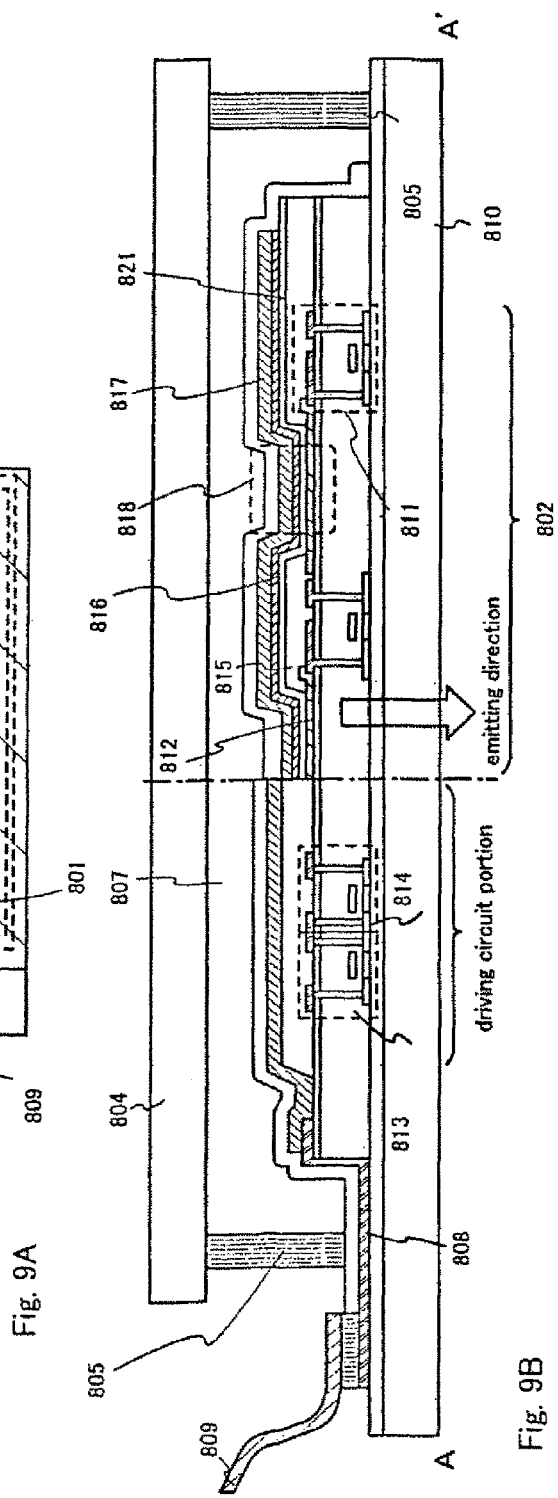

As this embodiment, the following will specifically describe a process in which the light emitting panel produced by a combined manufacturing step of Embodiments 1 to 10 as illustrated in FIG. 6B is caused to be completed as a light emitting device, referring to FIGS. 9A and 9B.

FIG. 9A is a top view of the light emitting panel wherein the element substrate is airtightly sealed, and FIG. 9B is a sectional view taken on line A-A' of FIG. 9A. Reference number 801 represents a source driving side circuit, which is illustrated by dot lines; reference number 802, a pixel section; reference number 803, a gate side driving circuit; reference number 804, a sealing substrate; and reference number 805, a sealing agent. The inside surround by the seal agent 805 is a space 807.

Through wirings (not illustrated) for transmitting signals inputted to the source side driving circuit 801 and the gate side driving circuit 803, video signals or clock signals are received from a flexible print circuit (FPC) 809, which is an external input terminal. The state that the FPC is connected to the light emitting panel is shown herein. In the present specification, any module on which integrated circuits (ICs) are directly mounted is referred to as a light emitting device.

Referring to FIG. 9B, the following will describe the sectional structure of the light emitting panel illustrated in FIG. 9A. The pixel section 802 and the driving circuit portion are formed above a substrate 810. The pixel section 802 is composed of pixels, each of which includes a current-controlling TFT 811 and an anode 812 connected electrically to its drain. The driving circuit portion is composed of a CMOS circuit wherein an n-channel type TFT 813 and a p-channel type TFT 814 are combined with each other.

Banks 815 is formed at both sides of each of the anodes 812. Thereafter, an organic compound layer 816 and cathodes 817 are formed on the anodes 812 to produce light emitting elements 818.

The cathodes 817 function as a wiring common to all of the pixels, and are electrically connected to the FPC 809 through a wiring 808.

The sealing substrate 804 made of glass is stuck to the substrate 810 with the sealing agent 805. As the sealing agent

805, an ultraviolet setting resin or thermosetting resin is preferably used. If necessary, a space composed of a resin film may be disposed in order to keep an interval between the sealing substrate 804 and the light emitting elements 818. An inert gas such as nitrogen or rare gas is filled into the space 807 surrounded by the sealing agent 805. It is desired that the sealing agent 805 is made of a material whose water- or oxygen-permeability is as small as possible.

By putting the light emitting elements airtightly into the space 807 in the above-mentioned structure, the light emitting elements can be completely shut off from the outside. As a result, it is possible to prevent the deterioration of the light emitting elements by water content or oxygen from the outside. Accordingly, a light emitting device having high reliability can be yielded.

The structure of this embodiment may be combined with the structure of Embodiment 1 to 10 at will.

Embodiment 12

Figure 10A:
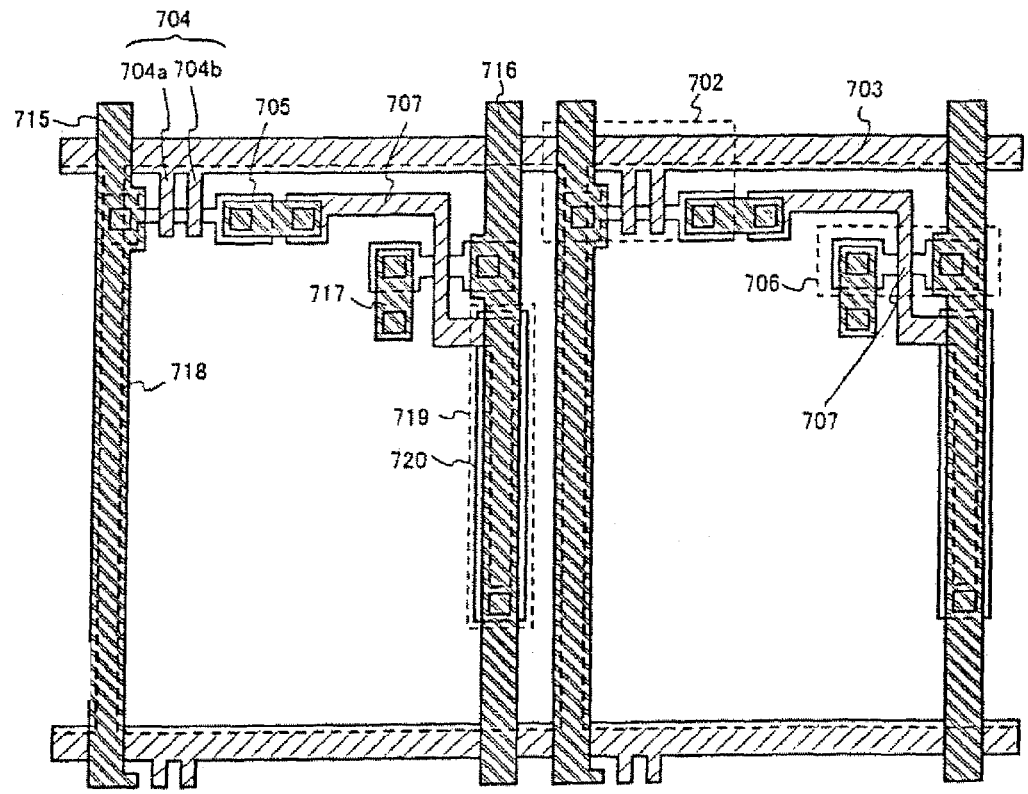
FIGS. 10A and 10B are diagrams showing the structure of a pixel portion of a light emitting device.
Figure 10B:
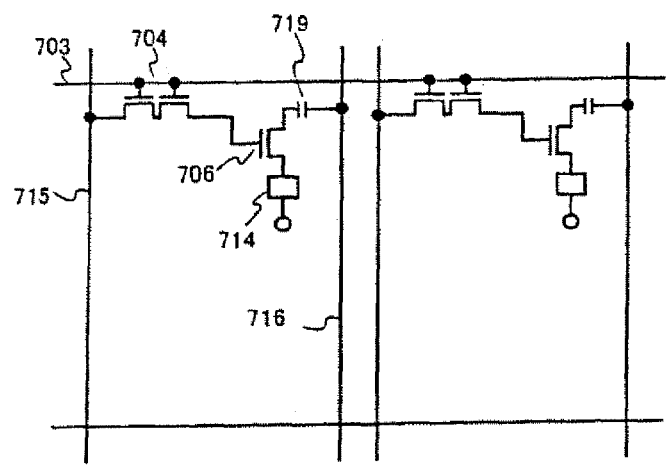

FIG. 10A more specifically illustrates the top face structure of the pixel section of the light emitting device produced using the present invention and described as FIG. 10A, and FIG. 10B illustrates a circuit diagram thereof. Referring to FIGS. 10A to 10B, a switching TFT 704 is composed of the switching (n-channel) TFT 1002 as illustrated in FIG. 6. Accordingly, about the structure thereof, the description on the switching (n-channel) TFT 1002 should be referred to. A wiring 703 is a gate wiring for connecting gate electrodes 704a and 704b of the switching TFT 704 electrically with each other.

In this embodiment, a double gate structure, wherein two channel forming regions are formed is adopted. However, a single gate structure, wherein one channel forming region is formed, or a triple gate structure, wherein three channel forming regions are formed, may be adopted.

The source of the switching TFT 704 is connected to a source wiring 715, and the drain thereof is connected to a drain wiring 705. The drain wiring 705 is electrically connected to a gate electrode 707 of the current-controlling TFT 706. The current-controlling TFT 706 is composed of the current-controlling (p-channel type) TFT 1003 in FIG. 6. Therefore, about the structure thereof, the description on the switching (p-channel) TFT 1003 should be referred to. In this embodiment, a single gate structure is adopted. However, a double gate structure or a triple gate structure may be adopted.

The source of the current-controlling TFT 706 is electrically connected to a current-supplying line 716. The drain thereof is electrically connected to a drain wiring 717. The drain wiring 717 is electrically connected to an anode (pixel electrode) 718 illustrated by dot lines.

In this case, a storage capacitor (condenser) is formed in a region 719. The condenser 719 is composed of a semiconductor layer 720 connected electrically to the current-supplying line 716, an insulating film (not illustrated) which is formed into the same layer as the gate insulating film, and the gate electrode 707. A capacitor composed of the gate electrode 707, a layer (not illustrated) that is formed into the same layer as the first interlayer dielectric, and the current-supplying line 716 may be used as a storage capacitor.

The structure of this embodiment may be combined with that of Embodiments 1 to 10.

Embodiment 13

Figure 23A:
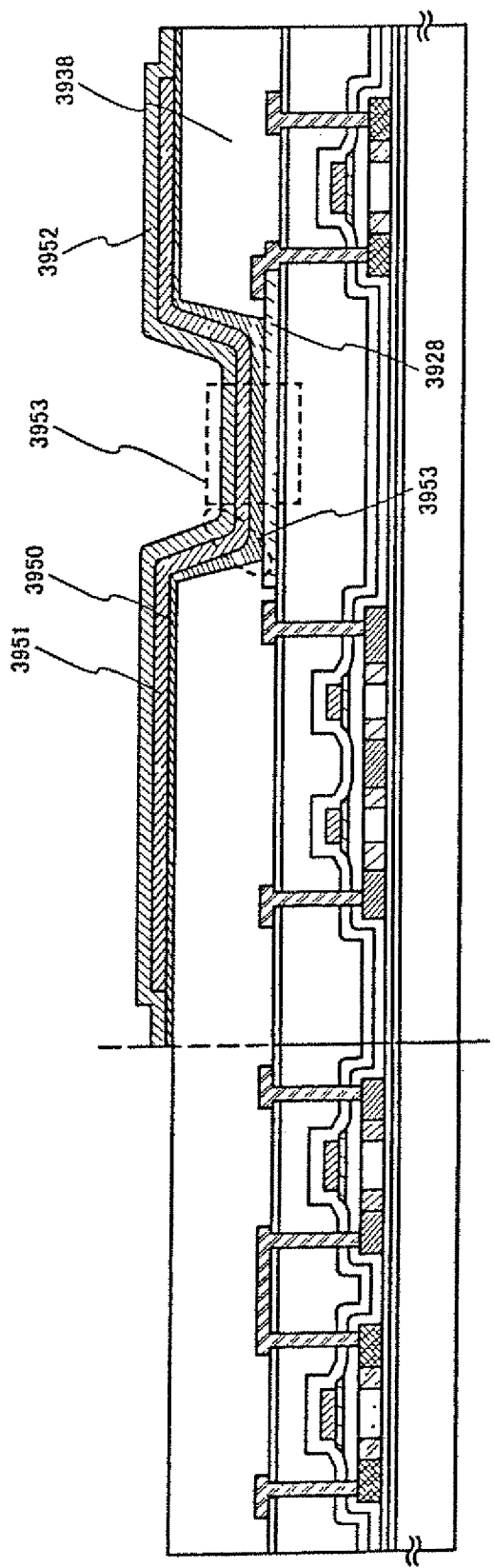
FIGS. 23A and 23B are diagrams showing an example of carrying out a light emitting device manufacture process.

Another example of the process steps for producing a light emitting device that is different from Example 2 will be described with reference to FIGS. 23(A) and (B).

The process steps are advanced according to Example 2 until the state of FIG. 22(A). Thereafter, the TFT substrate is transported into the second processing room, and the antielectrostatic film is removed by water washing. A bank 3938 is then formed as shown in FIG. 23(A). The bank 3938 may be covered with an insulating film, such as a silicon nitride film, on the surface thereof as similar to Embodiment 2, or in alternative, may be subjected to surface modification by carrying out plasma treatment as similar to Embodiment 8.

A first organic compound layer 3950 formed with a polymer organic compound is initially formed on the anode 3928 by a spin coating method, a spraying method or the like. The layer is formed with a polymer organic compound material having a positive hole transporting property or a polymer organic compound material having a high positive hole mobility. As the polymer organic compound material, polyethylene dioxythiophene (PEDOT) may be used.

A second organic compound layer 3951, such as a light emitting layer and an electron transporting layer, and a cathode 3952, which are to be formed thereon, may be formed in the similar manner as in Embodiment 1.

Figure 23B:
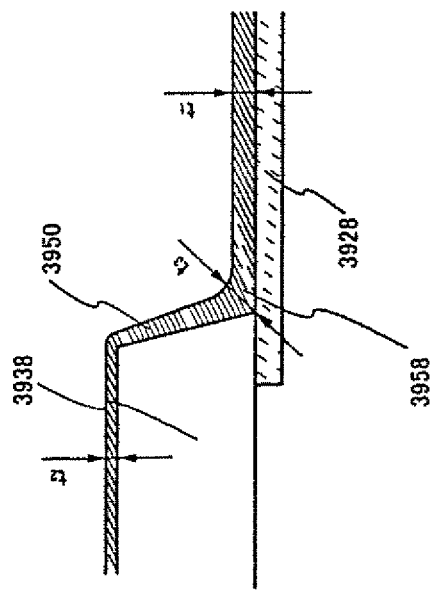

As shown in FIG. 23(B) in detail, the thickness of the first organic compound layer 3950 can be differentiated between the thickness (t1) on the anode 3928 and the thickness (t2) on the bank 3938 by appropriately changing the viscosity. In other words, the thickness (t1) on the anode 3928 can be larger, owing to the concave portion formed from the anode 3928 and the bank 3938.

The thickness (t3) at an edge part 3958, at which the anode 3928 and the bank 3938 are in contact with each other, becomes the maximum, and the layer can be formed to have a certain curvature. According to the form, the covering properties of a second organic compound layer 3951 and a cathode 3952 formed as upper layers thereof can be improved. Furthermore, cracking due to stress concentration and electric field concentration are suppressed to prevent the light emitting element from failure due to deterioration and short circuit.

Embodiment 14

A light emitting device using a light emitting element is self-luminous and therefore is superior in visibility in bright surroundings compared to liquid crystal display devices and has wider viewing angle. Accordingly, various electronic devices can be completed by using the light emitting device of the present invention.

Examples of electronic appliance employing a light emitting device of the present invention are: a video camera; a digital camera; a goggle type display (head mounted display); a navigation system; an audio reproducing device (car audio, an audio component, and the like); a laptop computer; a game machine; a portable information terminal (a mobile computer, a cellular phone, a portable game machine, an electronic book, etc.); and an image reproducing device (specifically, an appliance capable of processing data in a recording medium such as a digital versatile disk (DVD) and having a display device that can display the image of the data). The light emitting device having a light emitting element is desirable particularly for a portable information terminal since its screen is often viewed obliquely and is required to have a wide viewing angle. Specific example of the electronic devices are shown in FIGS. 11A to 11H.

Figure 11A:
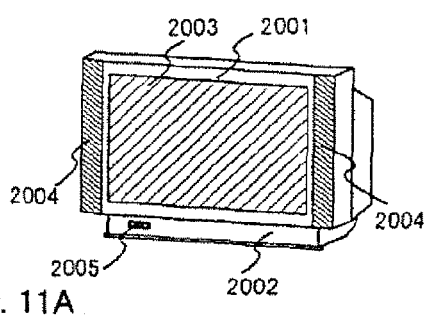
FIGS. 11A to 11H are diagrams showing examples of an electric appliance.

FIG. 11A shows a display device, which is composed of a casing 2001, a supporting base 2002, a display unit 2003, speaker units 2004, a video input terminal 2005, etc. The light emitting device of the present invention is applied can be used for the display unit 2003. The light emitting device having a light emitting element is self-luminous and does not need a backlight, so that it can make a thinner display unit than liquid crystal display devices can. The term display device includes every display device for displaying information such as one for a personal computer, one for receiving TV broadcasting, and one for advertisement.

Figure 11B:
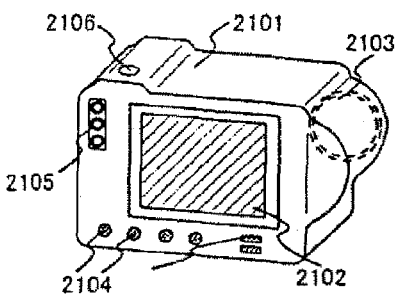

FIG. 11B shows a digital still camera, which is composed of a main body 2101, a display unit 2102, an image receiving unit 2103, operation keys 2104, an external connection port 2105, a shutter 2106, etc. The digital camera is formed by using the light emitting device of the present invention to the display unit 2102.

Figure 11C:
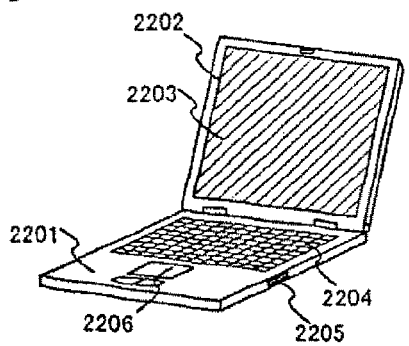

FIG. 11C shows a laptop computer, which is composed of a main body 2201, a casing 2202, a display unit 2203, a keyboard 2204, an external connection port 2205, a pointing mouse 2206, etc. The laptop computer is formed by using the light emitting device of the present invention to the display unit 2203.

Figure 11D:
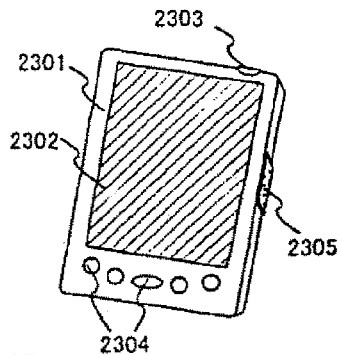

FIG. 11D shows a mobile computer, which is composed of a main body 2301, a display unit 2302, a switch 2303, operation keys 2304, an infrared ray port 2305, etc. The mobile computer is formed by using the light emitting device of the present invention to the display unit 2302.

Figure 11E:
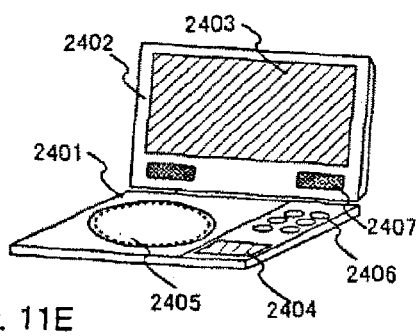

FIG. 11E shows a portable image reproducing device equipped with a recording medium (a DVD player, to be specific). The device is composed of a main body 2401, a casing 2402, a display unit A 2403, a display unit B 2404, a recording medium (DVD) reading unit 2405, operation keys 2406, speaker units 2407, etc. The display unit A 2403 mainly displays image information whereas the display unit B 2404 mainly displays text information. The portable image reproducing device is formed by using the light emitting device of the present invention to the display units A 2403 and B 2404. The term image reproducing device equipped with a recording medium includes video game machines.

Figure 11F:
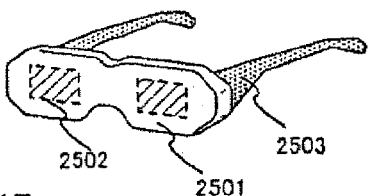

FIG. 11F shows a goggle type display (head mounted display), which is composed of a main body 2501, display units 2502, and arm units 2503. The goggle type display is formed by using the light emitting device of the present invention to the display unit 2502.

Figure 11G:
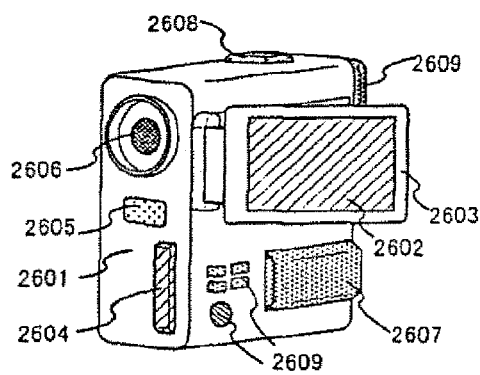

FIG. 11G shows a video camera, which is composed of a main body 2601, a display unit 2602 a casing 2603, an external connection port 2604, a remote control receiving unit 2605, an image receiving unit 2606, a battery 2607, an audio input unit 2608, operation keys 2609, etc. The video camera is formed by using the light emitting device of the present invention to the display unit 2602.

Figure 11H:
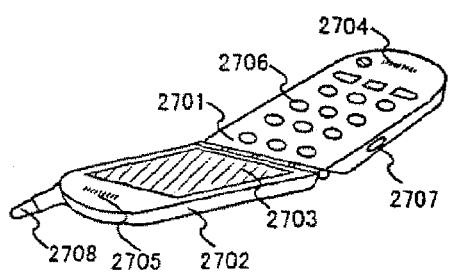

FIG. 11H shows a cellular phone, which is composed of a main body 2701, a casing 2702, a display unit 2703, an audio input unit 2704, an audio output unit 2705, operation keys 2706, an external connection port 2707, an antenna 2708, etc. The cellular phone is formed by using the light emitting device of the present invention to the display unit 2703. If the display unit 2703 displays white characters on a black background, power consumption of the cellular phone can be reduced.

If the luminance of light emitted from organic materials is increased in future, the light emitting device having an organic element can be used also in a front or rear projector in which light bearing outputted image information is magnified by a lens or the like to be projected on a screen.

The electronic device given in the above often displays information distributed through electronic communication lines such as Internet and CATV (cable television), especially, animation information with increasing frequency. The light emitting device having a light emitting element is suitable for displaying animation information since organic materials have fast response speed.

In the light emitting device, portions that emit light consume power. Therefore it is desirable to display information such that as small portions as possible emits light. Accordingly, if the light emitting device is used for a display unit that mainly displays text information such as a portable information terminal, in particular, a cellular phone, and an audio reproducing device, it is desirable to assign light emitting portions to display text information while portions that do not emit light serve as the background.

As described above, the application range of the light emitting device to which the present invention is applied is very wide and electronic appliance of every field can employ the device. The electronic appliance in this embodiment can be completed by using to the light emitting device manufactured by implementing the method shown in Embodiments 1 to 13.

By applying the present invention, cracking of an anode is reduced and therefore degradation of a light emitting element can be prevented. The present invention also includes leveling the surface of the anode, thereby increasing the current density in an organic compound layer. As a result, the drive voltage can be lowered and the lifetime of the light emitting element can be prolonged.

Moreover, the invention is capable of moving a substrate between a processing MOM for forming a TFT substrate and a processing room for forming a light emitting element that are physically separated from each other without causing degradation of TFT characteristics or electrostatic discharge damage. The structure of the present invention can solve the problems of contaminating the TFT with an alkaline metal used as a material of the light emitting element and of degrading the light emitting element with moisture or gas, and therefore can provide an excellent light emitting device.

What is claimed is:

1. A light emitting device comprising:
   a thin film transistor;
   a first insulating film including an inorganic insulating material over the thin film transistor;
   a second insulating film including an organic resin material over the first insulating film;
   a first electrode over the second insulating film;
   a bank including an organic resin material, the bank covering an edge of the first electrode;
   an organic compound layer including a first region having a first thickness over the first electrode and a second region having a second thickness over the bank; and
   a second electrode over the organic compound layer,
   wherein the first thickness is larger than the second thickness, and
   wherein a source or drain electrode of the thin film transistor is electrically connected to the first electrode.

2. The light emitting device according to claim 1, wherein the first electrode is formed from indium oxide with 2 to 20% of zinc oxide mixed therein.

3. The light emitting device according to claim 1, wherein a thickness of the organic compound layer at an edge part, at which the first electrode and the bank are in contact with each other, is larger than the first thickness and the second thickness.

4. The light emitting device according to claim 1, wherein the organic compound layer is formed by a spin coating method or a spraying method.

5. The light emitting device according to claim 1, wherein the light emitting device is incorporated into one of a digital camera, a cellular phone, a mobile computer, a video camera, a goggle type display, a navigation system, an audio reproducing device, a personal computer, a game machine, a portable game machine, an electronic book, and an image reproducing device.

6. The light emitting device according to claim 1, wherein the first electrode is an anode.

7. A light emitting device comprising:
a thin film transistor;
a first insulating film including an organic resin material over the thin film transistor;
a second insulating film including a silicon oxide film, a silicon oxynitride film, or a silicon nitride film, over the first insulating film;
a first electrode over the second insulating film;
a bank including an organic resin material, the bank covering an edge of the first electrode;
an organic compound layer including a first region having a first thickness over the first electrode and a second region having a second thickness over the bank; and
a second electrode over the organic compound layer,
wherein the first thickness is larger than the second thickness.

8. The light emitting device according to claim 7, wherein the first electrode is formed from indium oxide with 2 to 20% of zinc oxide mixed therein.

9. The light emitting device according to claim 7, wherein a thickness of the organic compound layer at an edge part, at which the first electrode and the bank are in contact with each other, is larger than the first thickness and the second thickness.

10. The light emitting device according to claim 7, wherein the organic compound layer is formed by a spin coating method or a spraying method.

11. The light emitting device according to claim 7, wherein the light emitting device is incorporated into one of a digital camera, a cellular phone, a mobile computer, a video camera, a goggle type display, a navigation system, an audio reproducing device, a personal computer, a game machine, a portable game machine, an electronic book, and an image reproducing device.

12. A light emitting device comprising:
a thin film transistor;
a first insulating film including an organic resin material over the thin film transistor, the first insulating film being a cured film formed by plasma treatment;
a second insulating film including a DLC film over the first insulating film;
a first electrode over the second insulating film;
a bank including an organic resin material, the bank covering an edge of the first electrode;
an organic compound layer including a first region having a first thickness over the first electrode and a second region having a second thickness over the bank; and
a second electrode over the organic compound layer,
wherein the first thickness is larger than the second thickness.

13. The light emitting device according to claim 12, wherein the first electrode is formed from indium oxide with 2 to 20% of zinc oxide mixed therein.

14. The light emitting device according to claim 12, wherein a thickness of the organic compound layer at an edge part, at which the first electrode and the bank are in contact with each other, is larger than the first thickness and the second thickness.

15. The light emitting device according to claim 12, wherein the organic compound layer is formed by a spin coating method or a spraying method.

16. The light emitting device according to claim 12, wherein the light emitting device is incorporated into one of a digital camera, a cellular phone, a mobile computer, a video camera, a goggle type display, a navigation system, an audio reproducing device, a personal computer, a game machine, a portable game machine, an electronic book, and an image reproducing device.

17. A light emitting device comprising:
a thin film transistor;
a first insulating film including an organic resin material over the thin film transistor;
a second insulating film including an aluminum oxide nitride film over the first insulating film;
a first electrode over the second insulating film;
a bank including an organic resin material, the bank covering an edge of the first electrode;
an organic compound layer including a first region having a first thickness over the first electrode and a second region having a second thickness over the bank; and
a second electrode over the organic compound layer,
wherein the first thickness is larger than the second thickness.

18. The light emitting device according to claim 17, wherein the first electrode is formed from indium oxide with 2 to 20% of zinc oxide mixed therein.

19. The light emitting device according to claim 17, wherein a thickness of the organic compound layer at an edge part, at which the first electrode and the bank are in contact with each other, is larger than the first thickness and the second thickness.

20. The light emitting device according to claim 17, wherein the organic compound layer is formed by a spin coating method or a spraying method.

21. The light emitting device according to claim 17, wherein the light emitting device is incorporated into one of a digital camera, a cellular phone, a mobile computer, a video camera, a goggle type display, a navigation system, an audio reproducing device, a personal computer, a game machine, a portable game machine, an electronic book, and an image reproducing device.

22. The light emitting device according to claim 1, wherein the organic compound layer has a curved upper surface at an edge part, at which the first electrode and the bank are in contact with each other.

23. The light emitting device according to claim 1, wherein the organic compound layer comprises a light emitting layer.

24. The light emitting device according to claim 1, wherein the first insulating film includes a silicon oxide film or a silicon oxynitride film.

25. The light emitting device according to claim 1, wherein the first insulating film includes a silicon nitride film.

26. The light emitting device according to claim 7, wherein the organic compound layer has a curved upper surface at an edge part, at which the first electrode and the bank are in contact with each other.

27. The light emitting device according to claim 7, wherein the organic compound layer comprises a light emitting layer.

28. The light emitting device according to claim 12, wherein the organic compound layer has a curved upper surface at an edge part, at which the first electrode and the bank are in contact with each other.

29. The light emitting device according to claim 12, wherein the organic compound layer comprises a light emitting layer.

30. The light emitting device according to claim 17, wherein the organic compound layer has a curved upper surface at an edge part, at which the first electrode and the bank are in contact with each other.

31. The light emitting device according to claim 17, wherein the organic compound layer comprises a light emitting layer.

* * * * *

UNITED STATES PATENT AND TRADEMARK OFFICE
CERTIFICATE OF CORRECTION

PATENT NO. : 8,497,525 B2
APPLICATION NO. : 12/898775
DATED : July 30, 2013
INVENTOR(S) : Hirokazu Yamagata et al.

It is certified that error appears in the above-identified patent and that said Letters Patent is hereby corrected as shown below:

In the Specification:

Column 3, line 67, "alkyl sultanate," should read "alkyl sulfonate,"

Column 4, line 28, "a light in emitting device;" should read "a light emitting device;"

Column 5, line 37, "is foamed to form" should read "is formed to form"

Column 7, line 7, "fanned by patterning" should read "formed by patterning"

Column 8, line 37, "film in a phase" should read "film in α phase"

Column 10, line 22, "foamed by ion doping" should read "formed by ion doping"

Column 13, lines 9-10, "before feinting light" should read "before forming light"

Column 18, line 42, "an organic in insulating" should read "an organic insulating"

Column 20, line 31, "is fanned in accordance" should read "is formed in accordance"

Column 20, line 38, "due to heat to generated" should read "due to heat generated"

Column 21, line 12, "is fowled before forming" should read "is formed before forming"

Column 21, line 16, "the to broken wiring line" should read "the broken wiring line"

Column 21, line 38, "50 nm from $SiN_4$," should read "50 nm from $SiH_4$,"

Column 23, line 18, "heating in a dean" should read "heating in a clean"

Column 23, line 28, "fainted through ozone" should read "formed through ozone"

Signed and Sealed this
First Day of October, 2013

Teresa Stanek Rea
*Deputy Director of the United States Patent and Trademark Office*

CERTIFICATE OF CORRECTION (continued)
U.S. Pat. No. 8,497,525 B2

Column 28, line 17, "using to the light" should read "using the light"

Column 28, line 27, "a processing MOM" should read "a processing room"